(12) United States Patent
Suzuki et al.

(10) Patent No.: US 7,948,311 B2
(45) Date of Patent: May 24, 2011

(54) POWER SERIES PREDISTORTER AND CONTROL METHOD THEREOF

(75) Inventors: Yasunori Suzuki, Yokohama (JP); Shoichi Narahashi, Yokohama (JP); Junya Ohkawara, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 12 days.

(21) Appl. No.: 12/555,420

(22) Filed: Sep. 8, 2009

(65) Prior Publication Data

US 2010/0060356 A1    Mar. 11, 2010

(30) Foreign Application Priority Data

Sep. 10, 2008 (JP) ................. 2008-231835
Sep. 1, 2009 (JP) ................. 2009-201241

(51) Int. Cl.
*H03F 1/26* (2006.01)
(52) U.S. Cl. .................... 330/149; 375/297
(58) Field of Classification Search ............ 330/149, 330/151; 375/296–297; 455/114.3
See application file for complete search history.

(56) References Cited

U.S. PATENT DOCUMENTS

| | | | | |
|---|---|---|---|---|
| 4,329,655 A | * | 5/1982 | Nojima et al. | 330/149 |
| 7,081,795 B2 | * | 7/2006 | Matsuura et al. | 330/149 |
| 7,196,576 B2 | * | 3/2007 | Mizuta et al. | 330/52 |

OTHER PUBLICATIONS

Toshio Nojima, et al., "Predistortion Nonlinear Compensator for Microwave SSB-AM System", IEICE Transactions, vol. J67-B, No. 1, Jan. 1984, pp. 78-85, (with partial English translation).
Shinji Mizuta, et al., "A New Adjustment Method for Frequency Characteristics Compensator of the Digital Predistortion Linearizer Compensating Frequency-Dependent IMD with Continuous Spectrum", C-2-15, Electronics Society Conference, IEICE, Sep. 2005, p. 35. (with English translation).

* cited by examiner

*Primary Examiner* — Hieu P Nguyen
(74) *Attorney, Agent, or Firm* — Oblon, Spivak, McClelland, Maier & Neustadt, L.L.P.

(57) ABSTRACT

A power series predistorter of the present invention includes a delay path for delaying a signal, a distortion generation path having an N-th order distortion generator and a vector adjuster, a divider for dividing an input signal between the delay path and the distortion generation path, a combiner for combining the output signal of the delay path and the output signal of the distortion generation path, and a controller for controlling the vector adjuster. The controller includes a setting unit, a distortion component measurement unit, a minimum condition calculation unit, and a recording unit. The setting unit specifies the phase or amplitude value of the vector adjuster. The distortion component measurement unit measures the distortion component of a power amplifier. The minimum condition calculation unit obtains a phase or amplitude value that minimizes the distortion component by function approximation, using the magnitude of the distortion components corresponding to three or more phase or amplitude values specified for sampling by the setting unit.

11 Claims, 18 Drawing Sheets

POWER SERIES PREDISTORTER AND CONTROL METHOD THEREOF

BACKGROUND OF THE INVENTION

1. Field of the Invention

The present invention relates to a power series predistorter for compensating for the distortion component produced by a power amplifier, and to a power series predistorter control method.

2. Description of the Related Art

A nonlinear distortion compensation method for a microwave transmit amplifier is a power series predistortion method. FIG. 1 shows a functional block diagram of a conventional power series predistorter 800. The power series predistorter 800 includes a delay path 825 for delaying a signal with a delay line 820, a distortion generation path 835 having a third-order distortion generator 830 and a vector adjuster 840, a divider 810 for dividing the input signal between the delay path 825 and the distortion generation path 835, a combiner 850 for combining the output of the delay path 825 and the output of the distortion generation path 835, and a controller 880 for minimizing the distortion component produced by a power amplifier (microwave transmit amplifier) 860 by controlling the vector coefficients of the vector adjuster 840. A directional coupler 870 returns a part of the output signal of the power amplifier 860 to the controller 880 through a control path 875. A distortion generation path generating a fifth or higher odd-order distortion component may be connected in parallel to the distortion generation path 835.

A vector coefficient control method of the power series predistorter uses two equal-amplitude pilot signals, as indicated in Toshio Nojima, Yoshiharu Okamoto, Toni Oyama, "Predistortion Nonlinear Compensator for Microwave SSB-AM System," IEICE Transactions, Vol. J67-B, No. 1, January 1984 (Non-Patent Document 1). The method of Non-Patent Document 1 executes the following processing. When the pilot signal is input to the power amplifier 860, an intermodulation distortion component produced in the power amplifier 860 generates a third-order intermodulation distortion component in the adjacent frequency of the pilot signal. The controller 880 detects the third-order intermodulation distortion component of the pilot signal from the output of the power amplifier 860 and controls the vector coefficients of the vector adjuster 840 in the distortion generation path so that the detected third-order intermodulation distortion component is minimized. The vector adjuster 840 includes a variable attenuation unit and a variable phase unit, which are not shown in the figure, and adjusts the amplitude component and the phase component, which are the vector coefficients, under the control of the controller 880.

The control algorithm of the controller 880 uses a perturbation method to follow temporal changes and temperature changes of the power series predistorter. In the perturbation method, the distortion components are measured when each of the specified vector coefficients is changed to a smaller value and a larger value, and the vector coefficient is specified again after a constant offset is applied in a direction in which the distortion component is reduced. The steps for setting the vector coefficients are repeated until the distortion components measured when each of the specified vector coefficients is changed to a smaller value and a larger value become equal.

FIG. 2 shows a functional block diagram of another conventional power series predistorter 900 indicated in Shinji Mizuta, Yasunori Suzuki, Shoichi Narahashi, Yasushi Yamao, "New Adjustment Method for Frequency Characteristics Compensator of the Digital Predistortion Linearizer Compensating Frequency-Dependent IMD with Continuous Spectrum," C-2-15, Electronics Society Conference, IEICE, September 2005 (Non-Patent Document 2). The power series predistorter 900 includes a delay path 925 for delaying a signal with a delay memory 920; a distortion generation path 935 having a third-order distortion generator 830, a vector adjuster 840, and a frequency characteristic compensator 990; a divider 810 for dividing the input signal between the delay path 925 and the distortion generation path 935; a combiner 850 for combining the output of the delay path 925 and the output of the distortion generation path 935; and a controller 980 for minimizing the distortion component produced by a power amplifier (microwave transmit amplifier) by controlling the vector adjuster 840 and frequency characteristic compensator 990. The frequency characteristic compensator 990 includes an N-point FFT unit 991, N complex multipliers 992-1 to 992-N, and an N-point inverse FFT unit 993. The N-point FFT unit 991 applies serial-to-parallel conversion to N points of the input signal and then applies N-point discrete Fourier transform to the parallel-converted N points of the input signal. The N-point inverse FFT unit 993 applies N-point inverse discrete Fourier transform to the output signals from the N complex multipliers 992-1 to 992-N and then applies parallel-to-serial conversion to the N inverse-Fourier-transformed output signals with a parallel-to-serial converter to generate N points of the output signal. The controller 980 minimizes the distortion component produced by the power amplifier by controlling the vector coefficients of the vector adjuster 840 and the complex multiplier coefficients of each of the complex multipliers 992-1 to 992-N. This power series digital predistorter is also controlled by the perturbation method.

In mobile communication systems, a base station transmitter performs transmission output power control so as to reduce interference between base stations while not degrading the channel capacity. In the W-CDMA system, for example, the transmission output power is changed by 1 dB at control intervals of 0.625 ms. As described above, the power series predistorter must specify the vector coefficients of the vector adjuster and the like to linearize the nonlinearity of the power amplifier. Accordingly, the power series predistorter must follow the dynamic changes in transmission output power.

The perturbation method, which is one conventional control method, was originally adopted to follow temporal changes or temperature changes, which are very slow in comparison with the control intervals of the transmission output power. The conventional control method provided to follow the temporal changes or temperature changes may not be able to follow the dynamic changes in transmission output power, because the perturbation method uses a constant offset value. One method of increasing the control speed of the perturbation method is to increase the offset value, but the increased offset value may increase the setting error of the vector adjuster. A decreased offset value cannot increase the control speed.

The same problem occurs in initial setting or during a transmission signal burst (state including a period of absence of the transmission signal), and a high-speed convergence algorithm has been needed.

In a power series digital predistorter provided with the frequency characteristic compensator, the complex multiplier coefficients must be specified for N complex multipliers. As the number of complex multiplier coefficients increases, a longer control time is needed.

Accordingly, it is an object of the present invention to provide a power series predistorter that can quickly set the coefficients of a vector adjuster thereof and the complex multiplier coefficients of the frequency characteristic compensator thereof, and a power series predistorter control method of the power series predistorter. More specifically, an object of the present invention is to provide a power series predistorter that can calculate these coefficients with a small calculation cost and that can compensate for the distortion component with the coefficients, and a power series predistorter control method of the power series predistorter.

SUMMARY OF THE INVENTION

A power series predistorter of the present invention includes a delay path for delaying a signal, a distortion generation path having an N-th (N is an odd number not smaller than 3) order distortion generator and a vector adjuster, a divider for dividing an input signal between the delay path and the distortion generation path, a combiner for combining the output of the delay path and the output of the distortion generation path, and a controller for controlling the vector adjuster. The controller includes a setting unit, a distortion component measurement unit, a minimum condition calculation unit, and a recording unit. The setting unit specifies the phase or amplitude value of the vector adjuster. The distortion component measurement unit measures the distortion components generated by a power amplifier. The minimum condition calculation unit obtains a phase or amplitude value that minimizes the distortion components, using the magnitude of the distortion components corresponding to three or more phase or amplitude values specified for sampling by the setting unit. The recording unit records three or more predetermined phase or amplitude values to be specified for sampling.

A power series predistorter control method of the power series predistorter described above includes a vector sampling step, a vector minimum condition calculation step, and a vector calculation result setting step. In the vector sampling step, the setting unit specifies the three or more phase or amplitude values for sampling, and the distortion component measurement unit measures the magnitude of the distortion components corresponding to the three or more phase or amplitude values. In the vector minimum condition calculation step, the minimum condition calculation unit obtains the phase or amplitude value that minimizes the distortion component, from the results of measurement in the vector sampling step. In the vector calculation result setting step, the setting unit specifies the phase or amplitude value in accordance with the result of calculation in the vector minimum condition calculation step.

Another power series predistorter of the present invention includes, in the distortion generation path, a frequency characteristic compensator instead of the vector adjuster, or a frequency characteristic compensator in addition to the vector adjuster. The frequency characteristic compensator includes an FFT unit for converting a time-domain signal to a frequency-domain signal, N complex multipliers, and an inverse FFT unit for converting the frequency-domain signal to a time-domain signal. The setting unit of the controller specifies a phase or amplitude value for each of the complex multipliers.

A power series predistorter control method of the power series predistorter described above also includes, for each of the complex multipliers, a complex multiplication sampling step, a complex multiplication minimum condition calculation step, and a complex multiplication calculation result setting step. In the complex multiplication sampling step, for one of the complex multipliers, the setting unit specifies three or more phase or amplitude values for sampling, and the distortion component measurement unit measures the magnitude of the distortion components corresponding to the three or more phase or amplitude values. In the complex multiplication minimum condition calculation step, for one of the complex multipliers, the minimum condition calculation unit obtains a phase or amplitude value that minimizes the distortion component, in accordance with the results of measurement in the complex multiplication sampling step. In the complex multiplication calculation result setting step, the setting unit specifies the phase or amplitude value, in accordance with the result of calculation in the complex multiplication minimum condition calculation step. The power series predistorter control method of the power series predistorter described above repeats the above-described processing the same number of times as that of the complex multipliers.

The minimum condition calculation unit may include a coefficient calculation section for obtaining the coefficients of a quadratic equation representing the relationship between the phase or amplitude values and the distortion components, from the distortion components corresponding to the three or more phase or amplitude values specified for sampling by the setting unit, and obtain the phase or amplitude value that minimizes the distortion components, from the coefficients of the quadratic equation obtained by the coefficient calculation section.

Effect of the Invention

According to a power series predistorter and a control method thereof in the present invention, a phase or amplitude value that minimizes the distortion component is obtained by using the magnitude of the distortion components corresponding to three or more phase or amplitude values specified for sampling, so that the distortion component can be compensated for with a smaller calculation cost than that of calculation required in the perturbation method and other conventional control methods. When the method obtains the coefficients of a quadratic equation representing the relationship between the phase or amplitude value and the distortion components, a phase or amplitude value that minimizes the distortion components can be obtained very easily. Therefore, in addition to temperature changes and temporal changes, transmission output power control of the base station transmitter can be followed.

The perturbation method and other conventional control methods adaptively search the phase and amplitude values that minimize the distortion components as unknown values. In contrast, the control method of the present invention obtains the phase and amplitude values that minimize the distortion components through the quadratic equation, by using distortion components acquired by sampling. In other words, unlike an adaptive algorithm such as that in the perturbation method, it is not necessary to search for the phase and amplitude values that minimize the distortion component. Therefore, the period of time required to specify the phase and amplitude values can be reduced. Distortion compensation can be performed with a small calculation cost. The amount of calculation required to obtain the coefficients the quadratic equation is much smaller than that required in the conventional adaptive algorithms such as RLS.

DETAILED DESCRIPTION OF THE PREFERRED EMBODIMENTS

Figure 1:
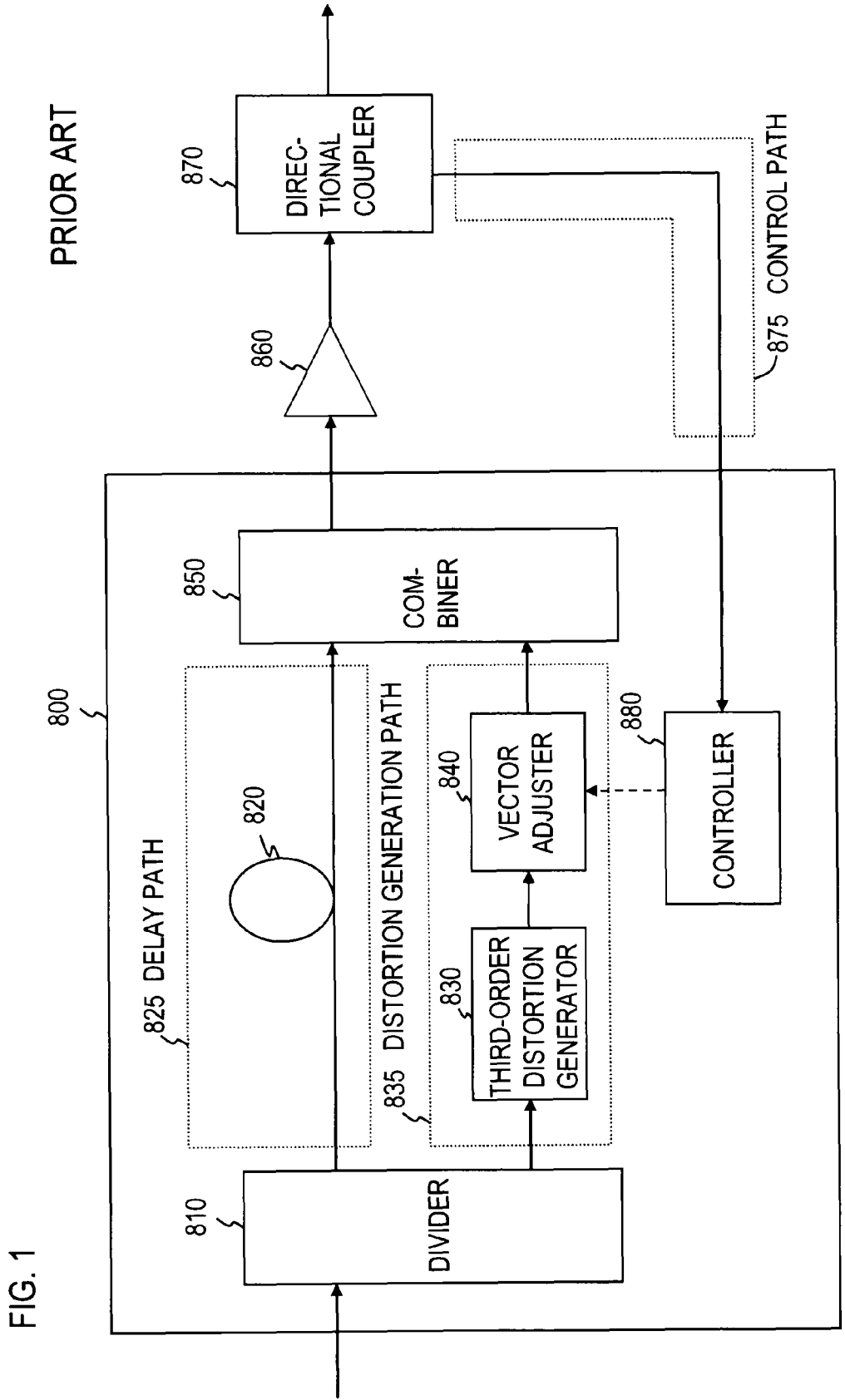
FIG. 1 shows a functional block diagram of a conventional power series predistorter.
Figure 2:
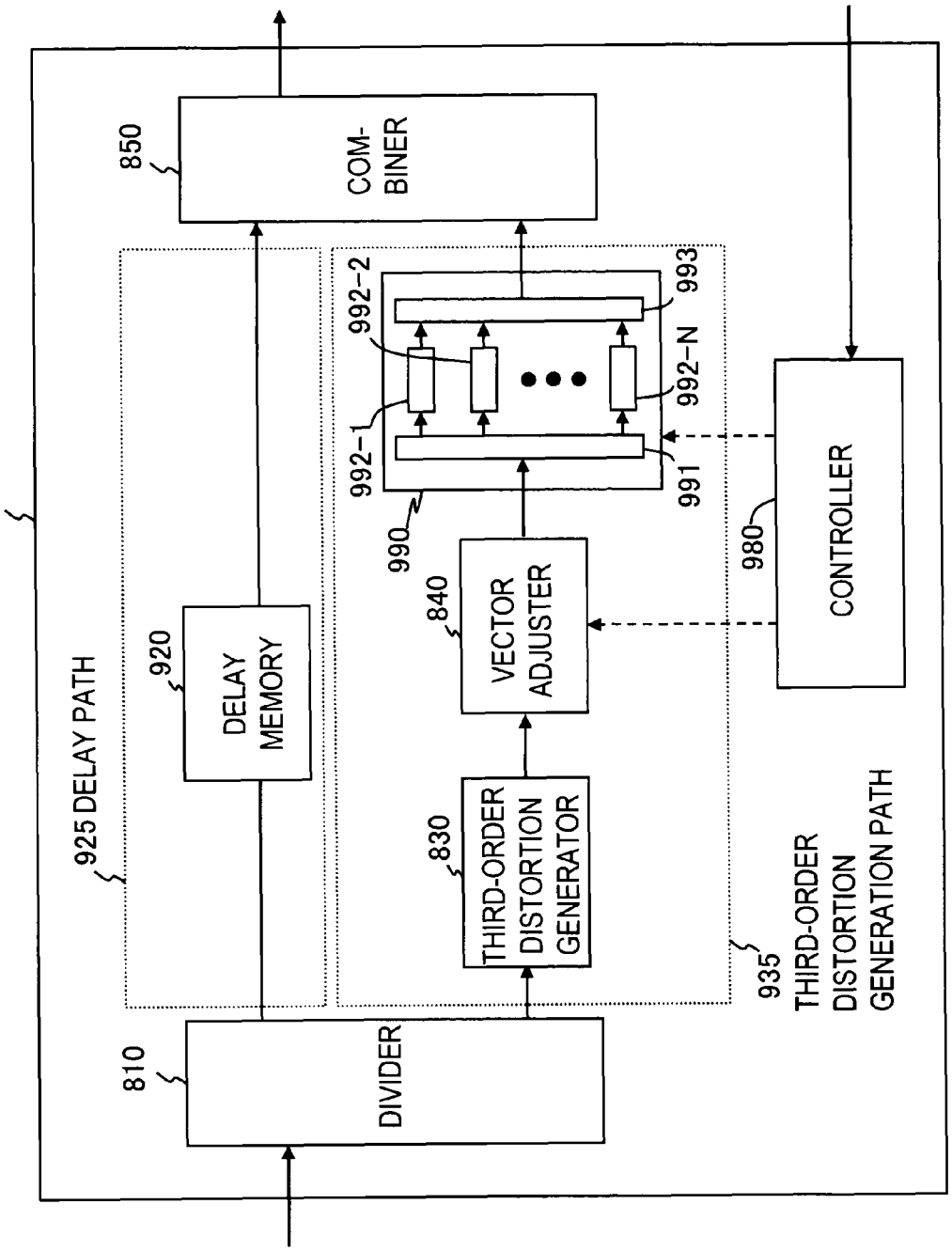
FIG. 2 shows a functional block diagram of another conventional power series predistorter.

Embodiments of the present invention will be described below. Like elements are indicated by like reference characters, and redundant explanations will be omitted.

First Embodiment

Figure 3:
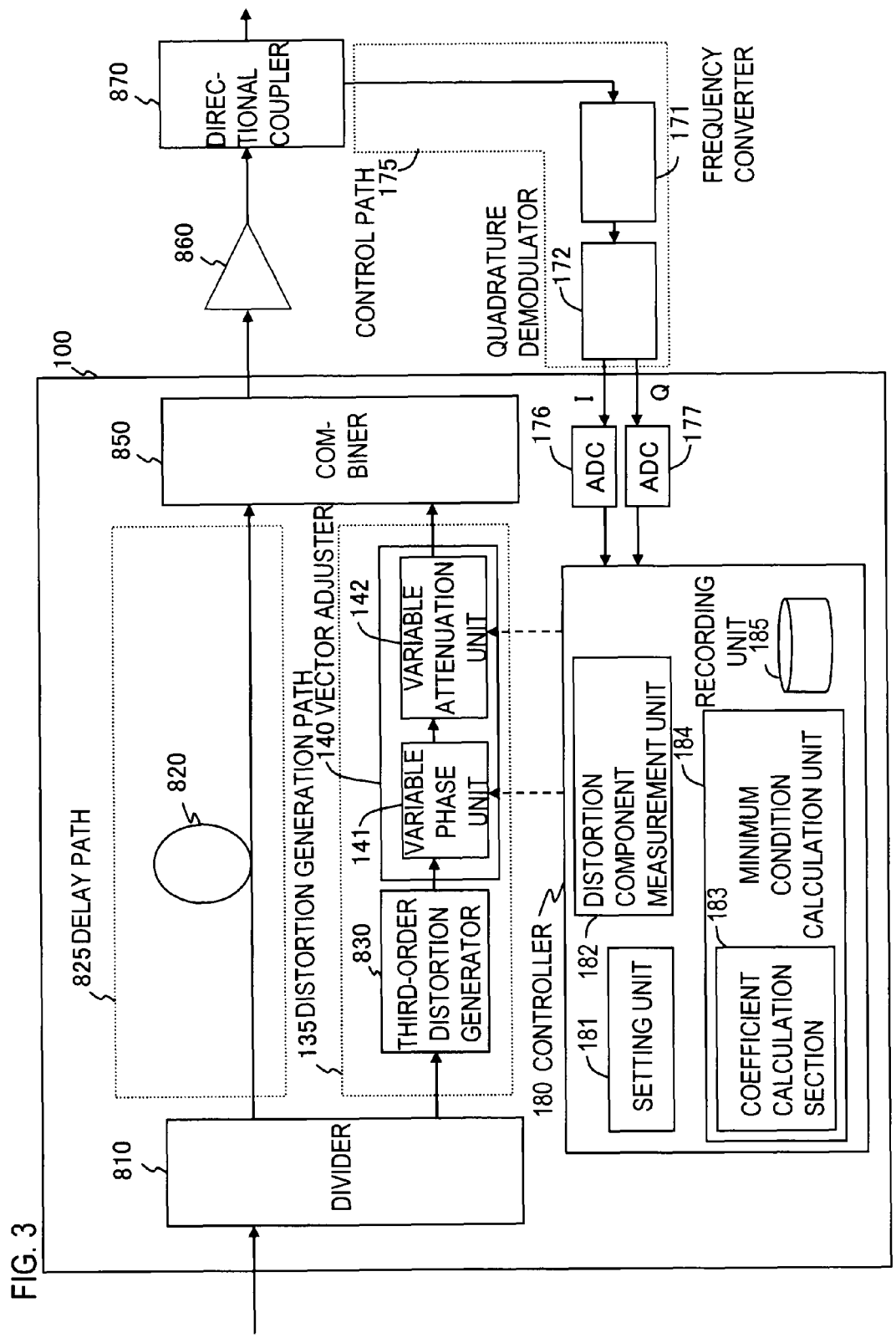
FIG. 3 shows a functional block diagram of a power series predistorter of a first embodiment.

FIG. 3 shows a functional block diagram of a power series predistorter 100 of a first embodiment. The power series predistorter 100 includes a delay path 825 for delaying a signal with a delay line 820, a distortion generation path 135 having a third-order distortion generator 830 and a vector adjuster 140, a divider 810 for dividing the input signal between the delay path 825 and the distortion generation path 135, a combiner 850 for combining the output of the delay path 825 and the output of the distortion generation path 135, and a controller 180 for controlling the vector adjuster 140. An N-th order distortion generation path (N is an odd number not smaller than 3) for generating a fifth or higher odd-order distortion component may be connected in parallel to the distortion generation path 135. The vector adjuster 140 includes a variable phase unit 141 for adjusting the phase and a variable attenuation unit 142 for adjusting the amplitude. The controller 180 includes a setting unit 181, a distortion component measurement unit 182, a minimum condition calculation unit 184, and a recording unit 185. The setting unit 181 specifies the phase or amplitude value of the vector adjuster 140. The distortion component measurement unit 182 measures the distortion component of a power amplifier 860. The minimum condition calculation unit 184 has a coefficient calculation section 183. The coefficient calculation section 183 obtains the coefficients of a quadratic equation representing the relationship between the phase or amplitude value and the distortion components, from the distortion components corresponding to three or more phase or amplitude values specified by the setting unit 181 for sampling. The minimum condition calculation unit 184 obtains a phase or amplitude value that minimizes the distortion component, from the coefficients of the quadratic equation obtained by the coefficient calculation section 183. The recording unit 185 records three or more predetermined phase or amplitude values to be specified for sampling.

The power amplifier 860 amplifies the output signal of the combiner 850. A directional coupler 870 outputs the output signal from the power amplifier 860 to the outside and a part of the output signal to the control path 175 to be returned to the controller 180 of the power series predistorter 100. The control path 175 has a frequency converter 171 and a quadrature demodulator 172. The frequency converter 171 downconverts the output signal of the power amplifier 860 from the RF band to the baseband. The quadrature demodulator 172 splits the output signal of the frequency converter 171 into an in-phase component (I component), which is in phase with the reference signal, and a quadrature phase component (Q component), which is orthogonal to the reference signal. ADCs 176 and 177 convert the I component and the Q component from analog to digital and output the results to the controller 180.

Figure 4:
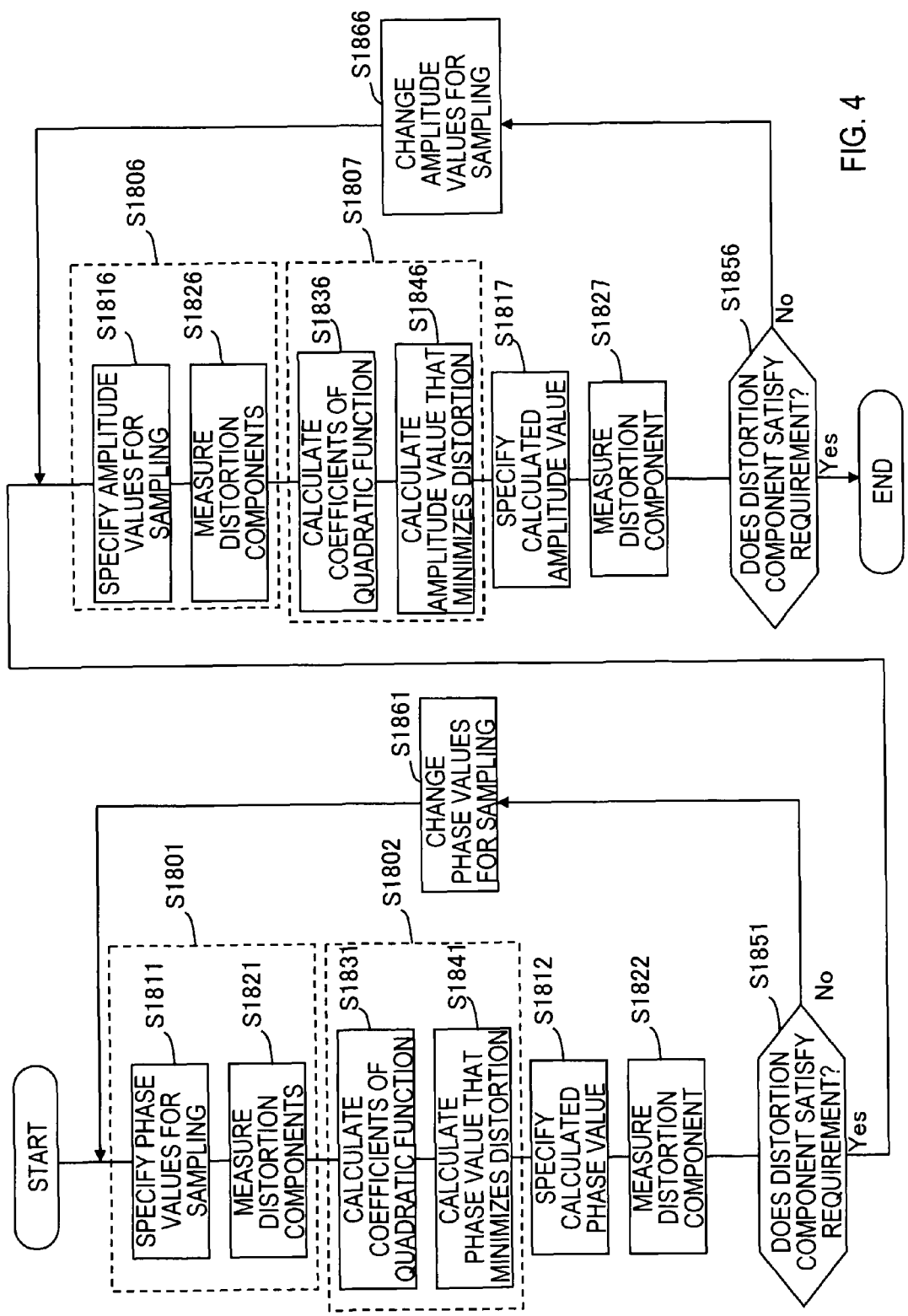
FIG. 4 shows a flowchart illustrating a control method of the power series predistorter, which uses a vector adjuster.

FIG. 4 shows a flowchart illustrating a control method of the power series predistorter 100. The control method of the power series predistorter 100 includes vector sampling processes (S1801, S1806), vector minimum condition calculation processes (S1802, S1807), and vector calculation result setting processes (S1812, S1817). The processing flow will now be described in detail. The setting unit 181 successively specifies the phase value of the vector adjuster 140 as three or more phase values for sampling, which are recorded in the recording unit 185 (S1811). For example, if the phase ranges from −P to +P and if three phase values $x_1$, $x_2$, and $x_3$ are specified, three predetermined phase values are specified as $x_1 = -\frac{2}{3}P$, $x_2 = 0$, and $x_3 = +\frac{2}{3}P$. The amplitude value (attenuation factor) is fixed at a predetermined value, such as 1, for example. The distortion component measurement unit 182 successively measures the magnitude of the distortion components $y_1, y_2, \ldots, y_M$ corresponding to the three or more phase values (M phase values $x_1, x_2, \ldots, x_M$) (S1821). Steps S1811 and S1821 form a vector sampling process (S1801).

The coefficient calculation section 183 obtains the coefficients of the quadratic equation representing the relationship between the phase values and distortion components (S1831), from the measurement results obtained in step S1821. The quadratic equation is as given below:

$$y = a_2 x^2 + a_1 x + a_0 \quad (1)$$

From the combinations of phase values and the magnitude of phase components, such as $(x_1, y_1), (x_2, y_2), \ldots, (x_M, y_M)$, the coefficients $a_2, a_1$, and $a_0$ of the quadratic equation are obtained by the least squares method or the like. If three phase values are given, the coefficients $a_2, a_1$, and $a_0$ of the quadratic equation should be obtained by solving the following simultaneous equations:

$$y_1 = a_2 x_1^2 + a_1 x_1 + a_0$$

$$y_2 = a_2 x_2^2 + a_1 x_2 + a_0$$

$$y_3 = a_2 x_3^2 + a_1 x_3 + a_0 \quad (2)$$

If $a_2 = 0$, the relationship between the phase values and the magnitude of the distortion components is represented by a linear function. In that case, the coefficients $a_1$ and $a_0$ should be obtained by the least squares method or the like. Next, the minimum condition calculation unit 184 obtains a phase value that minimizes the distortion components within the variable range of the phase value (range in which the phase value can be specified), by using the coefficients $a_2, a_1$, and $a_0$ of the quadratic equation obtained in step S1831 (S1841). If the phase value $$x = -a_1/(2a_2) \quad (3)$$

is within the variable range of the phase value, this value x can be specified as the phase value. If $a_2 = 0$ and if the phase value $$x = -a_0/a_1 \quad (4)$$

is within the variable range of the phase value, this value x can be specified as the phase value. Steps S1831 and S1841 form a vector minimum condition calculation process (S1802). The setting unit 181 sets up the variable phase unit 141 (S1812) so that the phase of the output of the vector adjuster 140 agrees with the phase value obtained in step S1841. This step corresponds to a vector calculation result setting process (S1812).

If $a_2$ is not 0, the coefficients $a_2, a_1$, and $a_0$ of the quadratic equation are calculated, for example, as indicated below. If the phase value is x, $a_2, a_1$, and $a_0$ can be obtained recursively, as shown below.

$$a_2 = \frac{\left(\left(\frac{Y_1}{M} - \frac{Y_2}{X_1}\right)\left(\frac{X_1}{M} - \frac{X_3}{X_2}\right) - \left(\frac{X_1}{M} - \frac{X_2}{X_1}\right)\left(\frac{Y_1}{M} - \frac{Y_3}{X_2}\right)\right)}{\left(\left(\frac{X_2}{M} - \frac{X_3}{X_1}\right)\left(\frac{X_1}{M} - \frac{X_3}{X_2}\right) - \left(\frac{X_1}{M} - \frac{X_2}{X_1}\right)\left(\frac{X_2}{M} - \frac{X_4}{X_2}\right)\right)} \quad (5)$$

$$a_1 = \frac{\left(\frac{Y_1}{M} - \frac{Y_2}{X_1}\right)/\left(\frac{X_1}{M} - \frac{X_2}{X_1}\right) -}{\left(\left(\frac{X_2}{M} - \frac{X_3}{X_1}\right)/\left(\frac{X_1}{M} - \frac{X_2}{X_1}\right)\right) a_2} \quad (6)$$

$$a_0 = \frac{Y_1}{M} - \left(\frac{X_1}{M}\right) a_1 - \left(\frac{X_2}{M}\right) a_2 \quad (7)$$

$$X_k = \sum_{t=1}^{M} x_t^k \quad (8)$$

$$Y_k = \sum_{t=1}^{M} y_t x_t^{k-1} \quad (9)$$

If $a_2 = 0$, the coefficients can be obtained as shown below.

$$a_1 = (MY_2 - X_1 Y_1)/(MX_2 - X_1^2) \quad (10)$$

$$a_0 = (MY_1 - X_1 Y_2)/(MX_2 - X_1^2) \quad (11)$$

Theoretically, the processing described above should specify a phase value that minimizes the distortion components. However, since there could be a measurement error or the like, a single processing session may not bring the magnitude of the distortion components down to the target level. So, the distortion component measurement unit 182 measures the magnitude of the distortion component (S1822). The controller 180 checks whether the magnitude of the distortion component satisfies the requirement (S1851). If the requirement is satisfied, the phase value setting process ends. If not, the phase values for sampling are changed (S1861). For example, the variable range of phase around the phase value for minimizing the distortion component, obtained in step S1841, is reduced to half (the previous variable range 2P is reduced to P, for example); three or more points is selected from the range; and the processing from step S1811 onward is repeated. By reducing the range of the phase values specified for sampling, the accuracy of the phase value for minimizing the distortion component can be improved.

After setting the phase value to the obtained value, the amplitude value is specified in the same manner. The setting unit 181 successively specifies the amplitude value as three or more amplitude values for sampling, which are recorded in the recording unit 185 (S1816). The distortion component measurement unit 182 successively measures the magnitude of the distortion components $y_1, y_2, \ldots, y_M$ corresponding to the three or more amplitude values (M amplitude values $x_1, x_2, \ldots, x_M$) (S1826). Steps S1816 and S1826 form a vector sampling process (S1806).

The coefficient calculation section 183 obtains the coefficients of a quadratic equation representing the relationship between the amplitude values and the distortion components (S1836), from the measurement results obtained in step S1826. The method of obtaining the coefficients is the same as the method of obtaining them for the phase value. Using the coefficients of the quadratic equation obtained in step S1836, the minimum condition calculation unit 184 obtains an amplitude value that minimizes the distortion component (S1846). Steps S1836 and S1846 form a vector minimum condition calculation process (S1807). The setting unit 181 sets up the variable attenuation unit 142 (S1817) so that the amplitude of the output of the vector adjuster 140 agrees with the amplitude value (attenuation factor) obtained in step S1846. This step corresponds to a vector calculation result setting process (S1817).

The distortion component measurement unit 182 measures the magnitude of the distortion component (S1827). The controller 180 checks whether the magnitude of the distortion component satisfies the requirement (S1856). If the requirement is satisfied, the amplitude value setting process ends. If not, the amplitude values for sampling are changed (S1866).

The processing flow described above does not depend on the order of the distortion generation path. If a plurality of distortion generation paths are provided, the processing described above should be carried out for each of the distortion generation paths. If third-order and fifth-order distortion generation paths are provided, the processing described above should be performed for the phase values and amplitude values of the third-order distortion generation path and the phase values and amplitude values of the fifth-order distortion generation path, in that order. The processing may be performed first for the values of the fifth-order distortion generation path and then for the values of the third-order distortion generation path.

According to the power series predistorter and control method thereof in the first embodiment, the coefficients of a quadratic equation are obtained by using the magnitude of the distortion components corresponding to three or more phase or amplitude values specified for sampling, and a phase or amplitude value that minimizes the distortion component is obtained, so that the distortion component can be minimized with a small amount of calculation. Therefore, temperature changes and temporal changes can be followed, and transmission output control of the base station transmitter can also be followed. The small amount of calculation allows the electric power consumption of the apparatus to be reduced.

Second Embodiment

Figure 5:
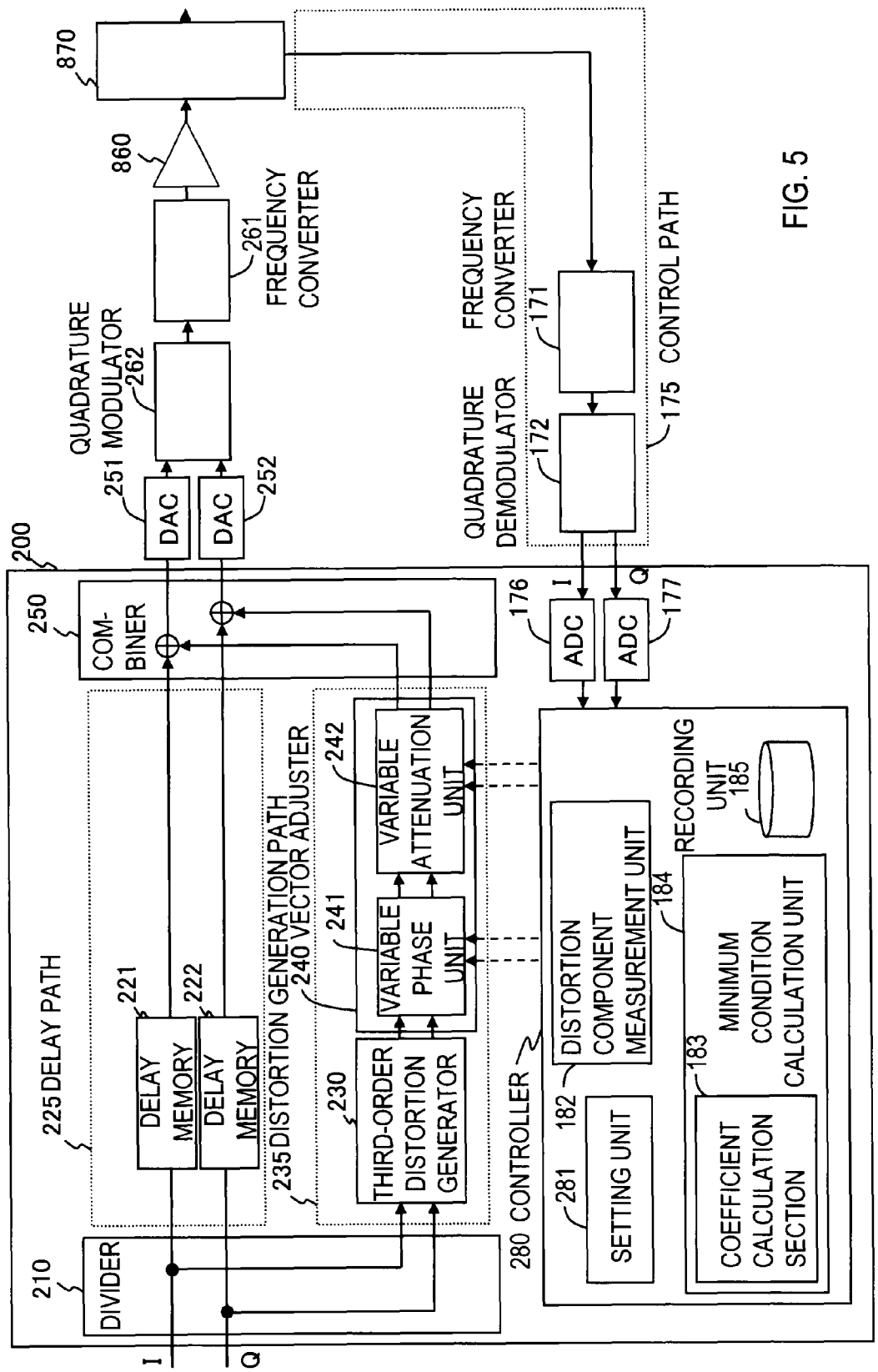
FIG. 5 shows a functional block diagram of a power series predistorter of a second embodiment.

FIG. 5 shows a functional block diagram of a power series predistorter 200 of a second embodiment. The power series predistorter 200 differs from the power series predistorter 100 of the first embodiment in that the distortion component generated by the power amplifier is compensated for by digital signal processing. Therefore, the power series predistorter 200 differs from the power series predistorter 100 in that the digital signal is handled internally; the I component and the Q component of the digital signal are input; and the I component and the Q component of the digital signal are output. The essential portions of the power series predistorter 200, such as the functional structure and the control method, are the same as those of the power series predistorter 100. The flowchart illustrating the control method of the power series predistorter 200 is the same as that shown in FIG. 4.

The power series predistorter 200 includes a delay path 225 for delaying a signal with delay memories 221 and 222, a distortion generation path 235 having a third-order distortion generator 230 and a vector adjuster 240, a divider 210 for dividing the input signal (I component, Q component) between the delay path 225 and the distortion generation path 235, a combiner 250 for combining the output signal (I component, Q component) of the delay path 225 and the output signal (I component, Q component) of the distortion generation path 235, and a controller 280 for controlling the vector adjuster 240. An N-th order distortion generation path (N is an odd number not smaller than 3) for generating a fifth or higher odd-order distortion component may be connected in parallel to the distortion generation path 235. The vector adjuster 240 includes a variable phase unit 241 for adjusting the phase and a variable attenuation unit 242 for adjusting the amplitude. The controller 280 includes a setting unit 281, a distortion component measurement unit 182, a minimum condition calculation unit 184, and a recording unit 185. The setting unit 281 specifies the phase or amplitude value of the vector adjuster 240. The distortion component measurement unit 182 measures the distortion component of a power amplifier 860. The minimum condition calculation unit 184 has a coefficient calculation section 183. The coefficient calculation section 183 obtains the coefficients of a quadratic equation representing the relationship between phase or amplitude values and distortion components, from the distortion components corresponding to three or more phase or amplitude values specified by the setting unit 281 for sampling. The minimum condition calculation unit 184 obtains a phase or amplitude value that minimizes the distortion component, from the coefficients of the quadratic equation obtained by the coefficient calculation section 183. The recording unit 185 records three or more predetermined phase or amplitude values to be specified for sampling.

Because the power series predistorter 200 outputs digital signals, the DACs 251 and 252 convert the signals from digital to analog. A quadrature modulator 262 generates a baseband analog signal from the I component and the Q component. A frequency converter 261 up-converts the signal from the baseband to the RF band. The other components are the same as in the first embodiment (FIG. 3).

The only difference between the power series predistorter and control method thereof in the second embodiment and those in the first embodiment is that a digital signal is handled. The distortion component can be minimized with a small amount of calculation, as in the first embodiment.

Third Embodiment

Figure 6:
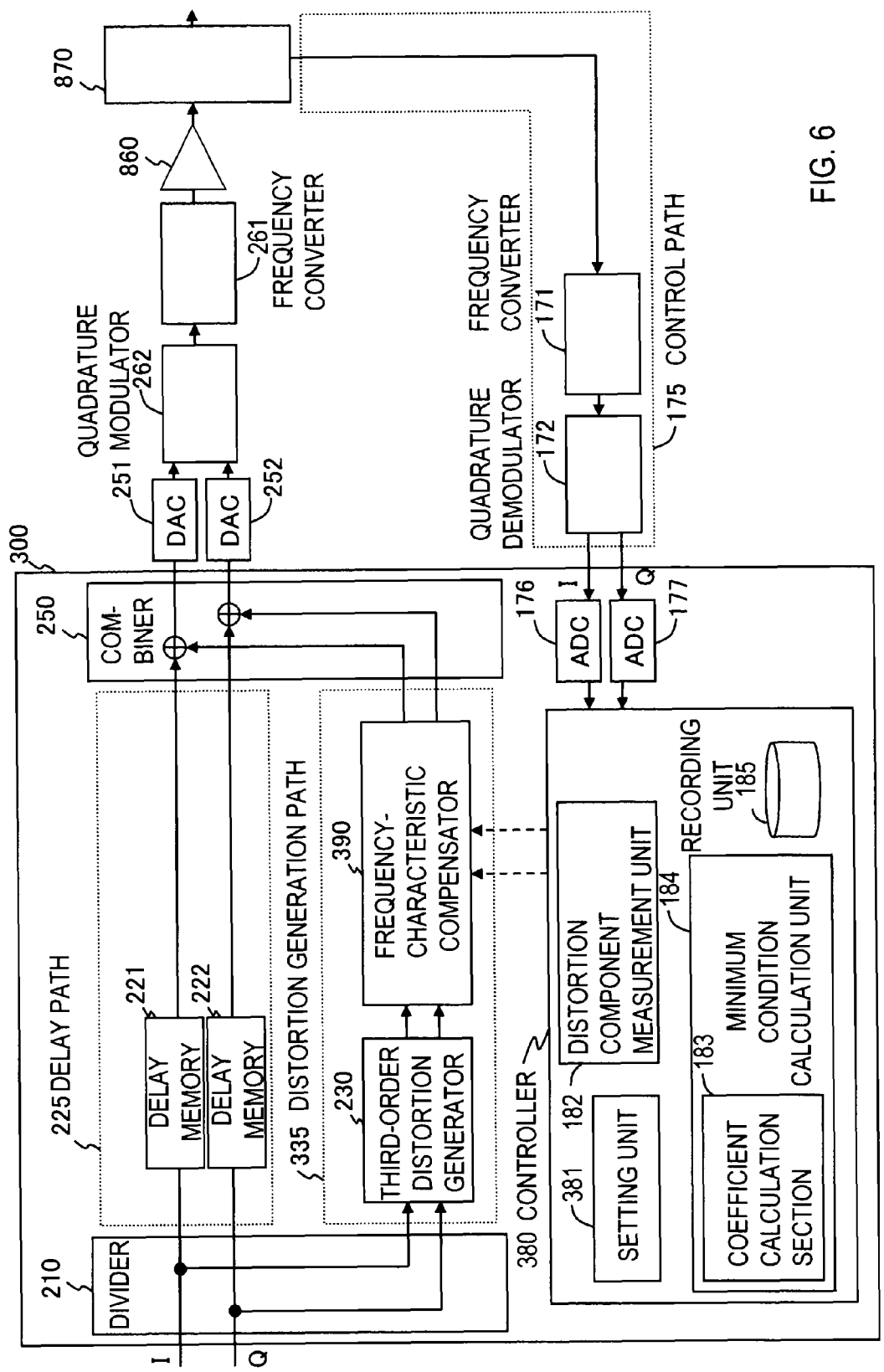
FIG. 6 shows a functional block diagram of a power series predistorter of a third embodiment.
Figure 7:
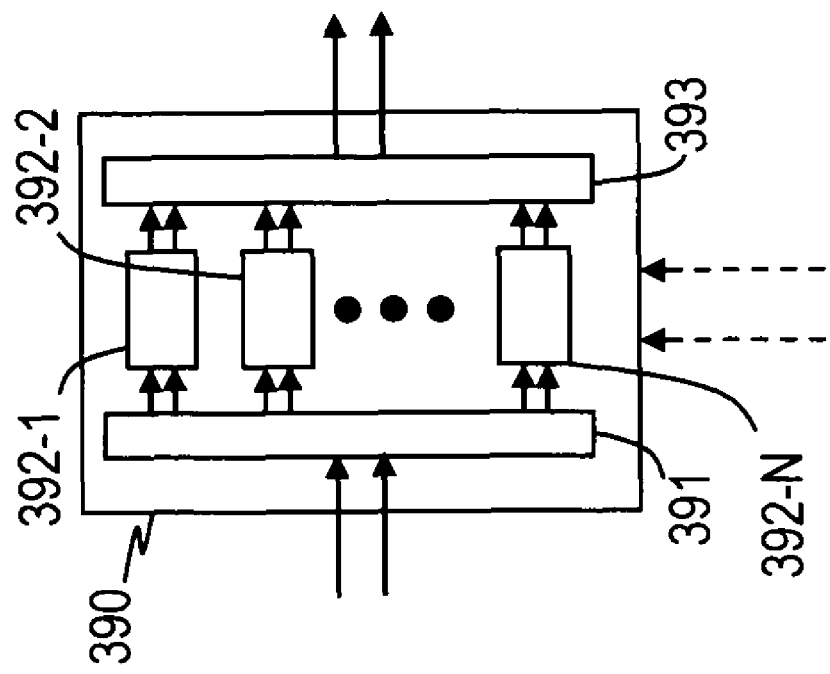
FIG. 7 shows a functional block diagram of a frequency characteristic compensator.
Figure 8:
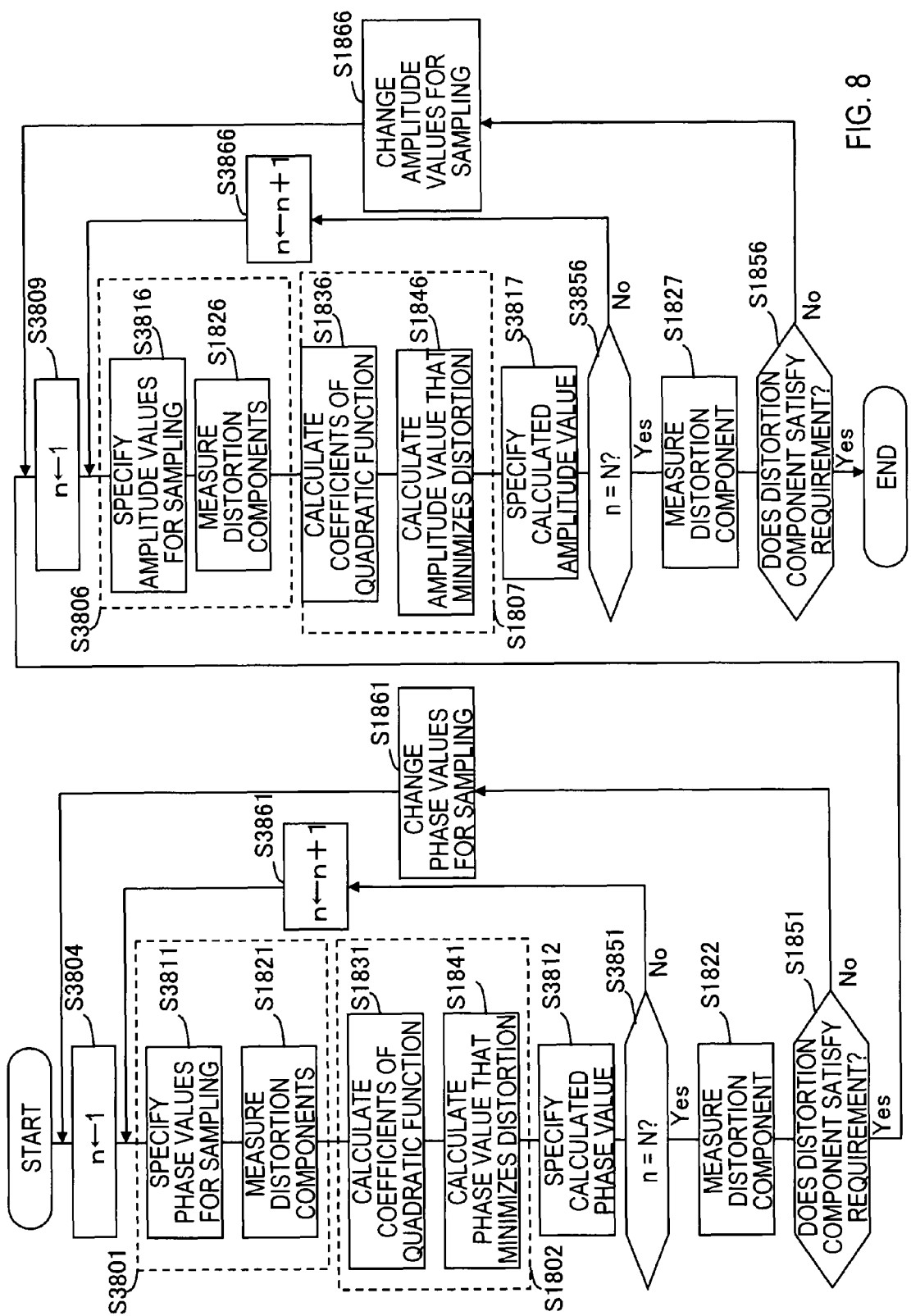
FIG. 8 shows a flowchart illustrating a control method of the power series predistorter, which uses a frequency characteristic compensator.

FIG. 6 shows a functional block diagram of a power series predistorter 300 of a third embodiment. The power series predistorter 300 differs from the power series predistorter 200 of the second embodiment in that a frequency characteristic compensator 390 is provided instead of the vector adjuster 240. FIG. 7 shows a functional block diagram of the frequency characteristic compensator 390. FIG. 8 shows a flowchart illustrating a control method of the power series predistorter 300.

The functional structure of the power series predistorter 300 is the same as that of the power series predistorter 200 except that the frequency characteristic compensator 390 is included instead of the vector adjuster 240, and a controller 380 is provided to control the frequency characteristic compensator 390. The frequency characteristic compensator 390 includes an FFT unit 391, N complex multipliers 392-n (n is an integer from 1 to N, and N is the order of the distortion component generated in the distortion generation path), and an inverse FFT unit 393. The FFT unit 391 applies serial-to-parallel conversion to N points of the input signal and then applies N-point discrete Fourier transform to the parallel-converted N points of the input signal to convert a time-domain digital signal into a frequency-domain digital signal. The inverse FFT unit 393 applies N-point inverse discrete Fourier transform to the outputs of the N complex multipliers 392-n and then applies parallel-to-serial conversion to convert the frequency-domain digital signal to a time-domain digital signal. The controller 380 includes a setting unit 381, a distortion component measurement unit 182, a minimum condition calculation unit 184, and a recording unit 185. The setting unit 381 specifies a phase or amplitude value for each of the N complex multipliers 392-n. The distortion component measurement unit 182 measures the distortion component of a power amplifier 860. The minimum condition calculation unit 184 has a coefficient calculation section 183. The coefficient calculation section 183 obtains the coefficients of a quadratic equation representing the relationship between the phase or amplitude values and distortion components, from the distortion components corresponding to three or more phase or amplitude values specified by the setting unit 381 for sampling. The minimum condition calculation unit 184 obtains a phase or amplitude value that minimizes the distortion component, from the coefficients of the quadratic equation obtained by the coefficient calculation section 183. The recording unit 185 records three or more predetermined phase or amplitude values to be specified for sampling.

The control method of the power series predistorter 300 includes complex multiplication sampling processes (S3801, S3806), complex multiplication minimum condition calculation processes (S1802, S1807), and complex multiplication calculation result setting processes (S3812, S3817). The processing flow will now be described in detail. The controller 380 assigns '1' to a variable n (S3804). The setting unit 381 successively specifies the phase value of the complex multiplier 392-$n$ (n is a value assigned in step S3804 or S3861) as three or more phase values for sampling, which are recorded in the recording unit 185 (S3811). The phase values can be specified in the same way as in the first embodiment. The distortion component measurement unit 182 successively measures the magnitude of distortion components $y_1$, $y_2, \ldots, y_M$ corresponding to the three or more phase values (M phase values $x_1, x_2, \ldots, x_M$) (S1821). Steps S3811 and S1821 form a complex multiplication sampling process (S3801).

The coefficient calculation section 183 obtains the coefficients of a quadratic equation representing the relationship between the phase values and distortion components (S1831), from the measurement results obtained in step S1821. The minimum condition calculation unit 184 obtains a phase value that minimizes the distortion component (S1841), by using the coefficients of the quadratic equation obtained in step S1831. In the third embodiment, steps S1831 and S1841 form a complex multiplication minimum condition calculation process (S1802). The setting unit 381 sets up the complex multiplier 392-$n$ (S3812) so that the phase of the output of the frequency characteristic compensator 390 agrees with the phase value obtained in step S1841. This step corresponds to a complex multiplication calculation result setting process.

The controller 380 checks whether n=N (S3851). If the result is No in step S3851, the controller 380 increments the value of n by 1 (S3861), and the processing returns to step S3811. If the result is Yes in step S3851, the distortion component measurement unit 182 measures the magnitude of the distortion component (S1822). Then, the controller 380 checks whether the magnitude of the distortion component satisfies a requirement (S1851). If the requirement is satisfied, the phase value setting process ends. If the requirement is not satisfied, the phase values for sampling are changed (S1861), and the processing from step S3804 onward is repeated.

The phase values of the complex multipliers 392-1 to 392-N are fixed at the corresponding obtained phase values, and the amplitude values are specified in the same way. More specifically, the controller 380 assigns 1 to a variable n (S3809). The setting unit 381 successively specifies the amplitude value of the complex multiplier 392-$n$ (n is the value assigned in step S3809 or S3866) to as three or more amplitude values for sampling, which are recorded in the recording unit 185 (S3816). The distortion component measurement unit 182 successively measures the magnitude of distortion components $y_1, y_2, y_M$ corresponding to the three or more amplitude values (M amplitude values $x_1, x_2, \ldots, x_M$) (S1826). Steps S3816 and S1826 form a complex multiplication sampling process (S3806).

The coefficient calculation section 183 obtains the coefficients of a quadratic equation representing the relationship between the amplitude values and the distortion components (S1836), from the measurement results obtained in step S1826. The minimum condition calculation unit 184 obtains an amplitude value that minimizes the distortion component (S1846), by using the coefficients of the quadratic equation obtained in step S1836. In the third embodiment, steps S1836 and S1846 form a complex multiplication minimum condition calculation process (S1807). The setting unit 381 sets up the complex multiplier 392-$n$ (S3817) so that the amplitude of the output of the frequency characteristic compensator 390 agrees with the amplitude value obtained in step S1846. This step corresponds to a complex multiplication calculation result setting process.

The controller 380 checks whether n=N (S3856). If the result is No in step S3856, the controller 380 increments the value of n by 1 (S3866), and the processing returns to step S3816. If the result is Yes in step S3856, the distortion component measurement unit 182 measures the magnitude of the distortion component (S1827). Then, the controller 380 checks whether the magnitude of the distortion component satisfies a requirement (S1856). If the requirement is satisfied, the amplitude value setting process ends. If the requirement is not satisfied, the amplitude values for sampling are changed (S1866), and the processing from step S3809 onward is repeated.

Figure 9A:
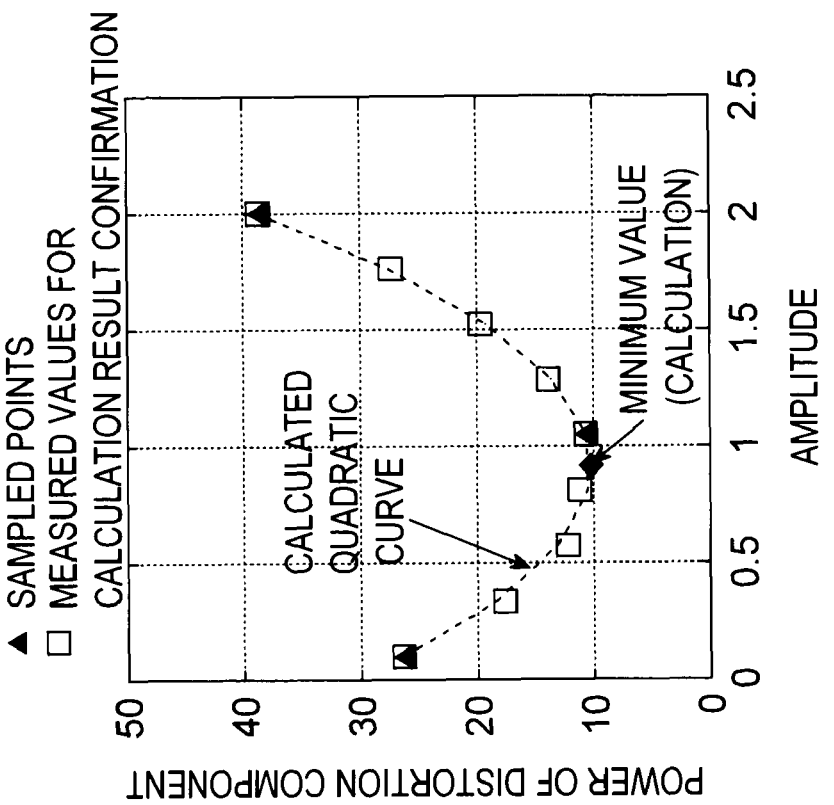
FIG. 9A shows the phase in the results of an experiment using the power series predistorter of the present invention.
Figure 9B:
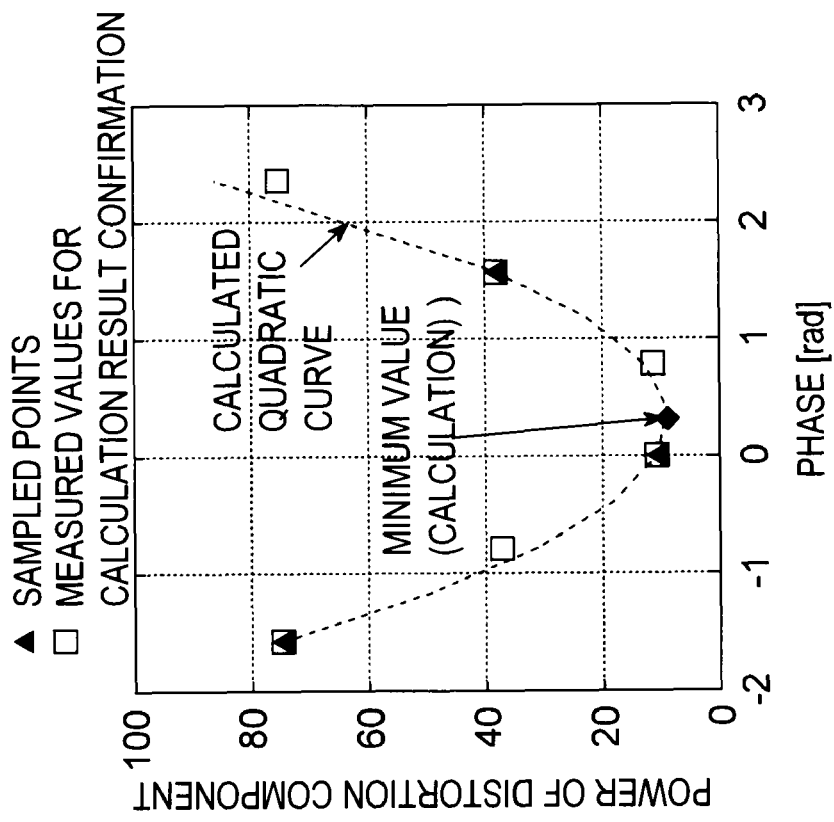
FIG. 9B shows the amplitude in the results of an experiment using the power series predistorter of the present invention.

FIGS. 9A and 9B show results of an experiment using the power series predistorter 300. In FIG. 9A showing the phase in the experimental results, the horizontal axis represents the phase difference, and the vertical axis represents the power of the distortion component. In FIG. 9B showing the amplitude in the experimental results, the horizontal axis represents the amplitude multiplying factor, and the vertical axis represents the power of the distortion component. The distortion component measured here is the distortion component (D1+D1) below (on the low frequency side of) the main signal in FIG. 10. In the experiment, a 2-GHz-band 1-W amplifier was used. The "sampled points" correspond to combinations of phase or amplitude values and the magnitude (power, in this experiment) of distortion components obtained in the complex multiplication sampling processes (S3801, S3806), such as ($x_1$, $y_1$), ($x_2$, $y_2$), and ($x_3$, $y_3$). The dotted line represents the quadratic function obtained from the sampled results. The "measured values for calculation result confirmation" indicate the phase or amplitude values and the power of the distortion components when the phase or amplitude value is measured at regular intervals. These diagrams show that the quadratic functions obtained from the sampled results agrees approximately with the "measured values for calculation result confirmation." The diagrams also show that the phase or amplitude value that minimizes the distortion component obtained by Expression (3) approximately equals the minimum value of the "measured values for confirming the calculation result." The experimental results indicate that a value close to the phase or amplitude value that minimizes the distortion component can be obtained by using the phase values or amplitude values at three points.

Figure 10:
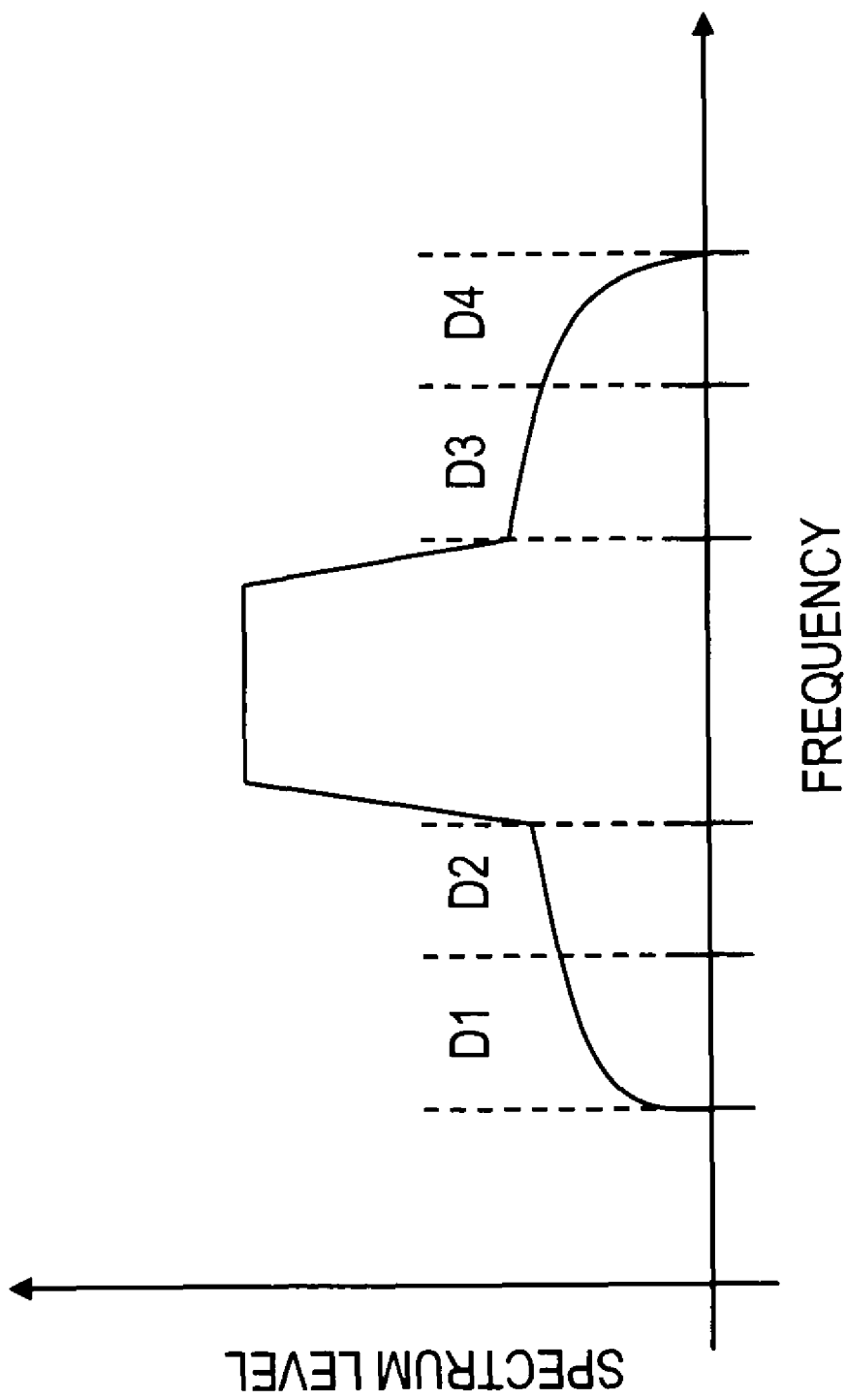
FIG. 10 shows an example of distortion compensation bands.

An experiment in which the distortion component bandwidth is limited, as shown in FIG. 10, will be described next. In the experiment, the third-order distortion components on the lower side (low-frequency side) and the upper side (high-frequency side) of the main signal are divided separately into two parts, and the components are indicated by D1, D2, D3, and D4, from the lowest. Complex multiplier coefficient control of the frequency characteristic compensator is performed successively for D2, D1, D3, and D4, in that order. Complex multiplier coefficient control is performed first for the amplitude values and then for the phase values.

Figure 11A:
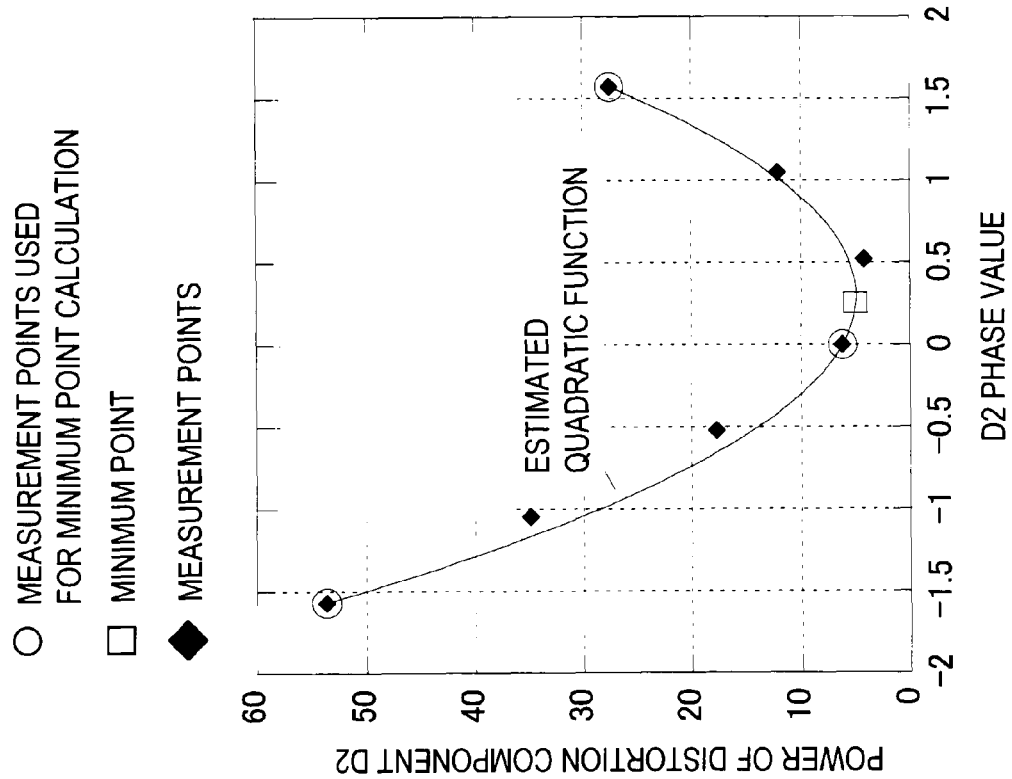
FIG. 11A shows the amplitude in the results of an experiment using the power series predistorter, in a distortion compensation band D2 in FIG. 10.
Figure 11B:
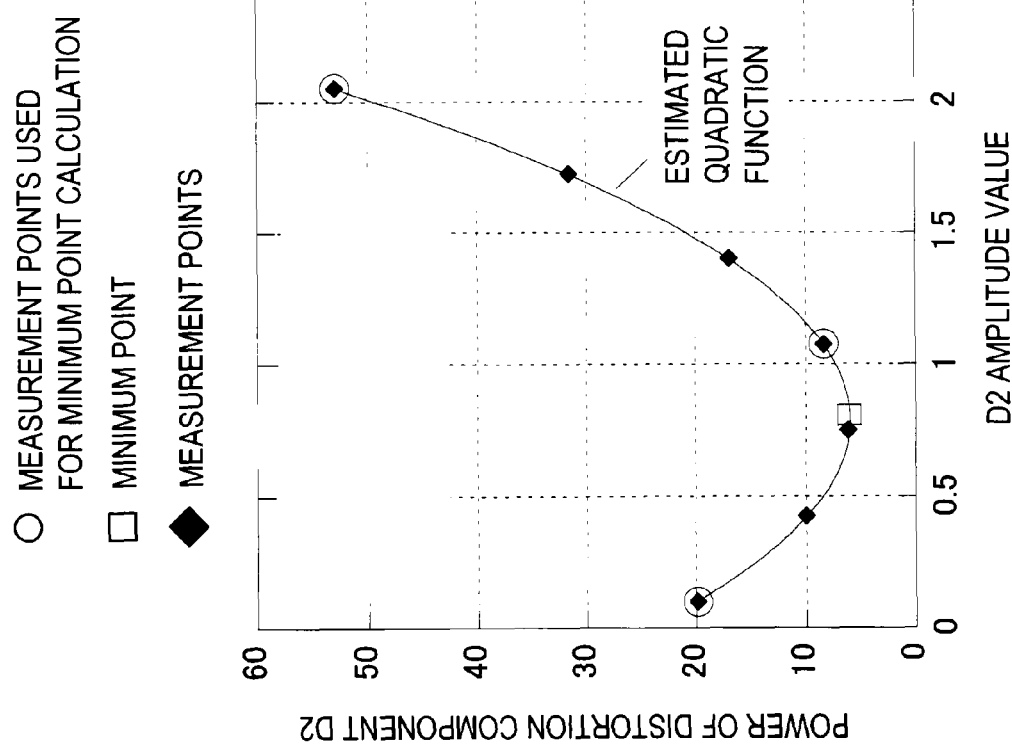
FIG. 11B shows the phase in the results of an experiment using the power series predistorter, in the distortion compensation band D2 in FIG. 10.

FIGS. 11A and 11B show the results of the experiment for the distortion component D2. FIGS. 11A and 11B show the amplitude values and phase values, respectively, in the experimental results. The "sampled points" are the "measurement points used for minimum point calculation" in the diagrams, and the "measured values for calculation result confirmation" are the "measurement points." The amplitude and phase values of D2 are specified as complex multiplier coefficients of the frequency characteristic compensator corresponding to the distortion component D2. The distortion component D2 is a band component corresponding to D2, obtained by converting the frequency of the signal detected by the distortion component measurement unit 182 in FIG. 6. The estimated quadratic functions are indicated by solid lines. FIGS. 11A and 11B show that the amplitude and phase values of D2 can be specified by using three measurement points. Comparison with all the measurement points indicates that the estimated quadratic functions do not vary greatly.

Figure 12B:
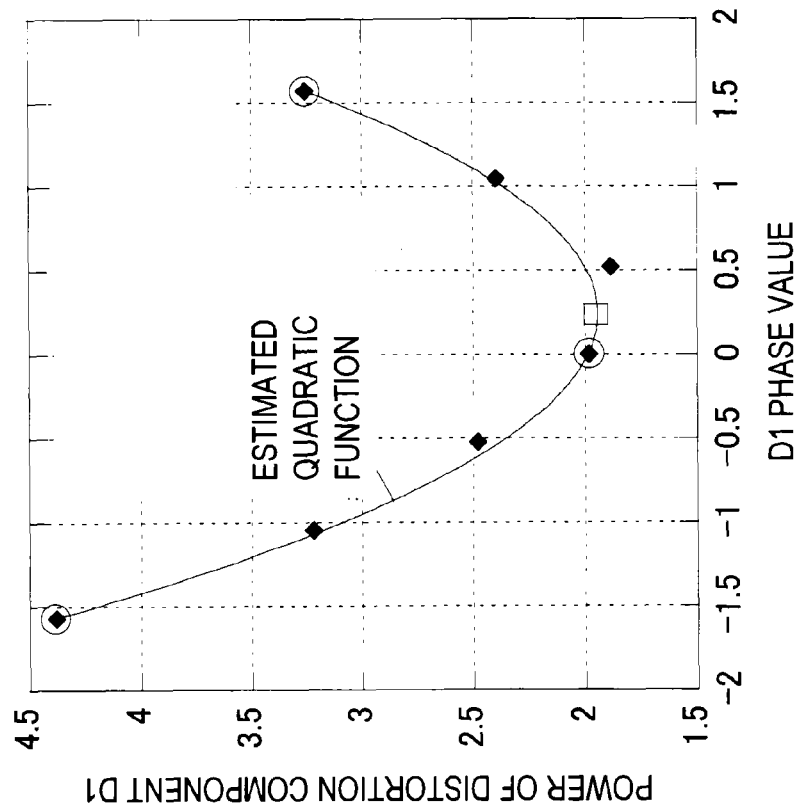
FIG. 12B shows the phase in the results of an experiment using the power series predistorter, in the distortion compensation band D1 in FIG. 10.
Figure 12A:
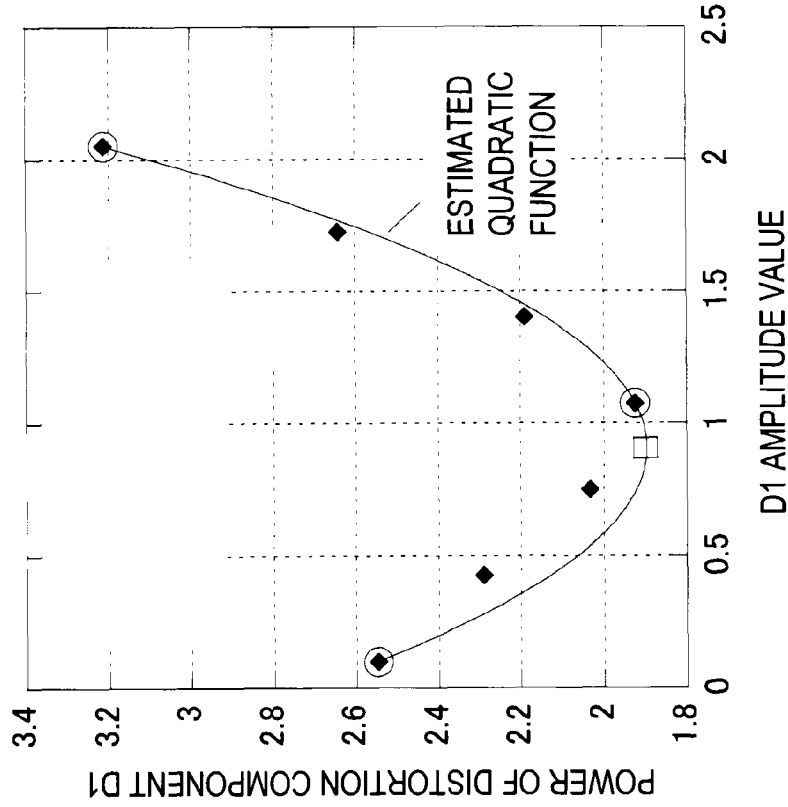
FIG. 12A shows the amplitude in the results of an experiment using the power series predistorter, in a distortion compensation band D1 in FIG. 10.
Figure 13A:
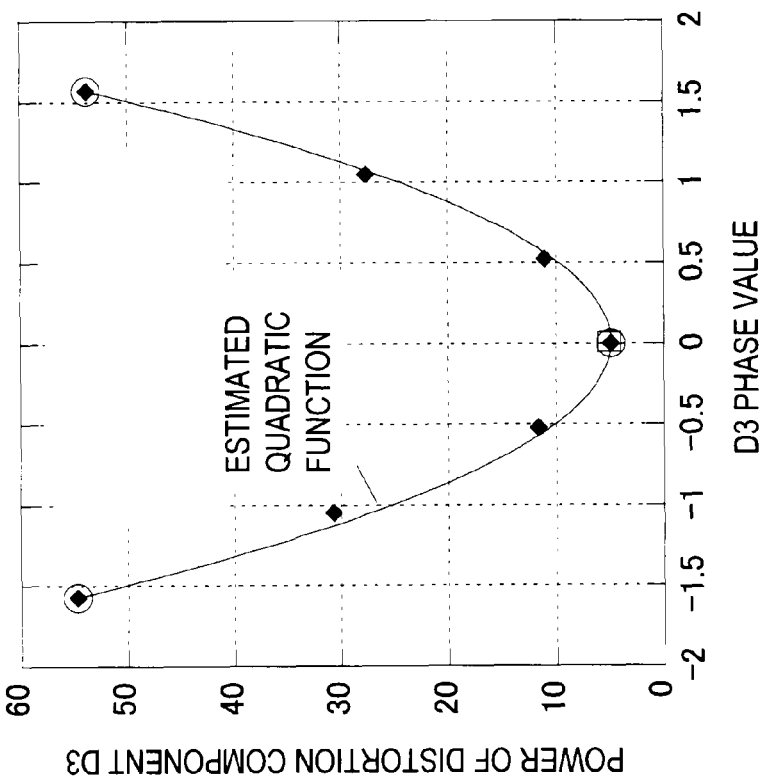
FIG. 13A shows the amplitude in the results of an experiment using the power series predistorter, in a distortion compensation band D3 in FIG. 10.
Figure 13B:
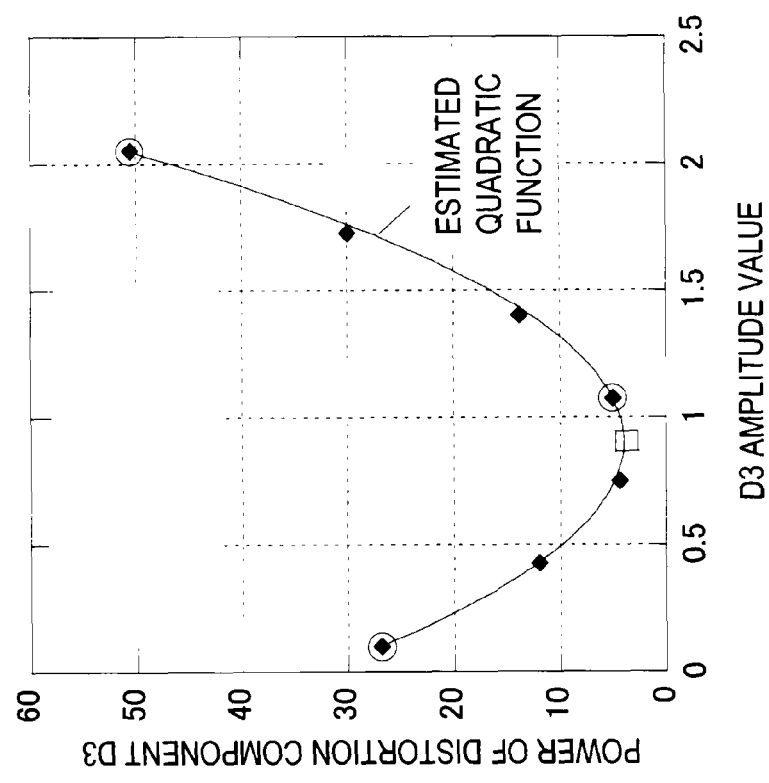
FIG. 13B shows the phase in the results of an experiment using the power series predistorter, in the distortion compensation band D3 in FIG. 10.
Figure 14B:
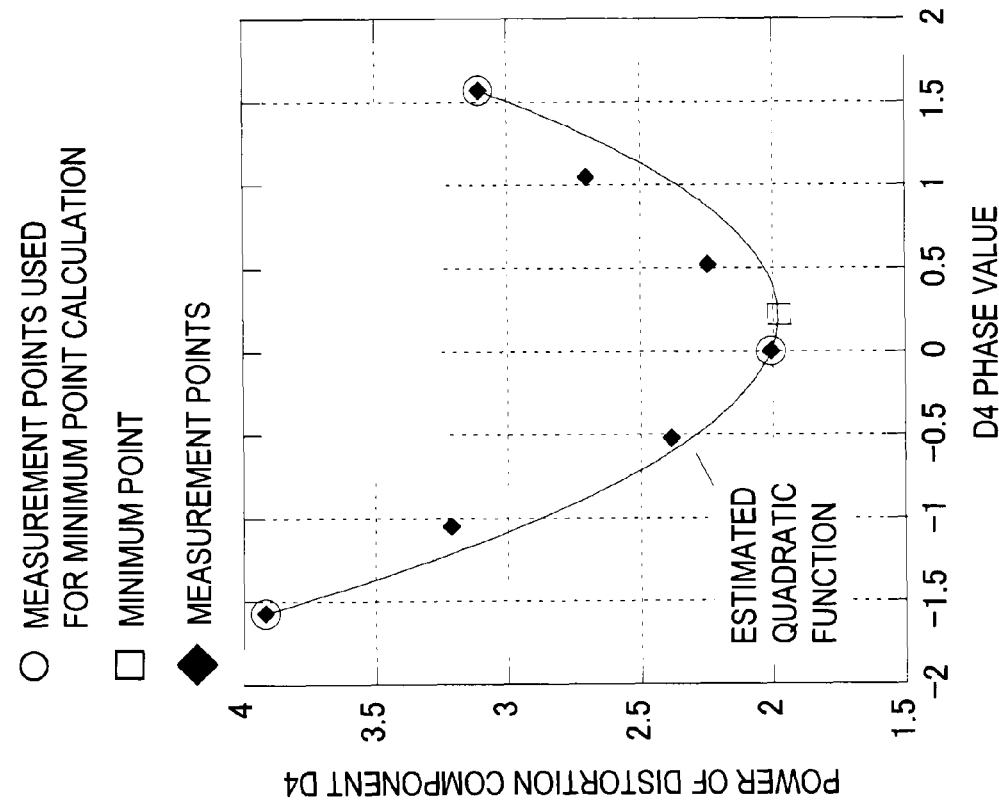
FIG. 14B shows the phase in the results of an experiment using the power series predistorter, in the distortion compensation band D4 in FIG. 10.
Figure 14A:
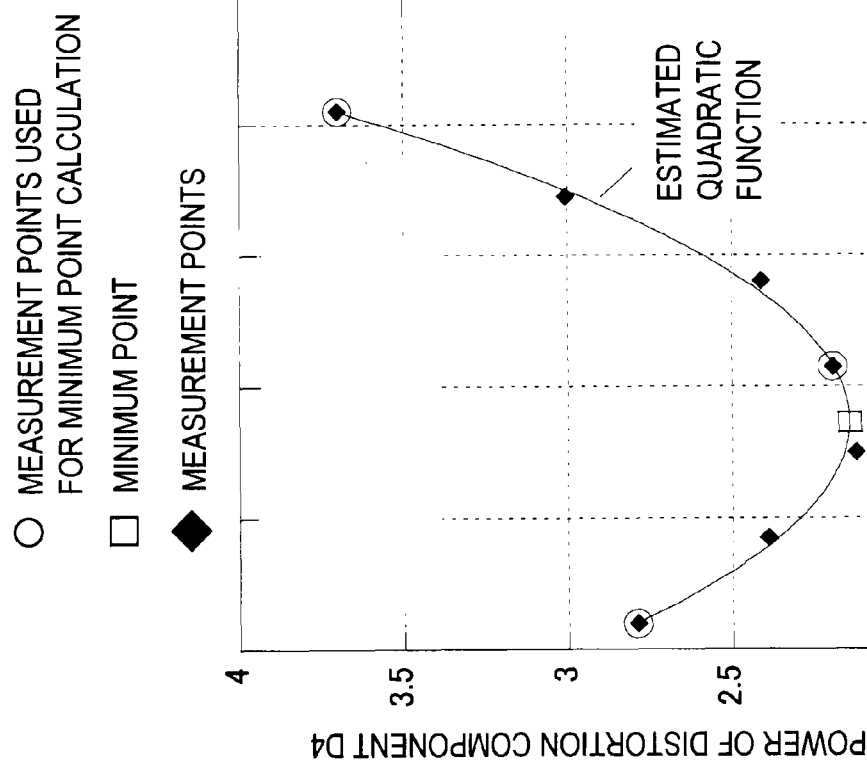
FIG. 14A shows the amplitude in the results of an experiment using the power series predistorter, in a distortion compensation band D4 in FIG. 10.

FIGS. 12A and 12B show the results of the experiment for the distortion component D1. In the same manner as in FIGS. 11A and 11B, comparison with all the measurement points indicates that the estimated quadratic functions do not vary greatly. The power of the distortion component D1 in FIGS. 12A and 12B is smaller than that in FIGS. 11A and 11B. That is because the distortion component D2, closer to the main signal, is greater than the distortion component D1, away from the main signal.

FIGS. 13A and 13B and FIGS. 14A and 14B show the results of the experiment for the distortion components D3 and D4, respectively. FIGS. 13A, 13B, 14A, and 14B show that comparison with all the measurement points indicates that the estimated quadratic functions do not vary greatly.

As described above, the complex multiplier coefficients of the frequency characteristic compensator can be specified as illustrated in the flowchart shown in FIG. 8.

Figure 15:
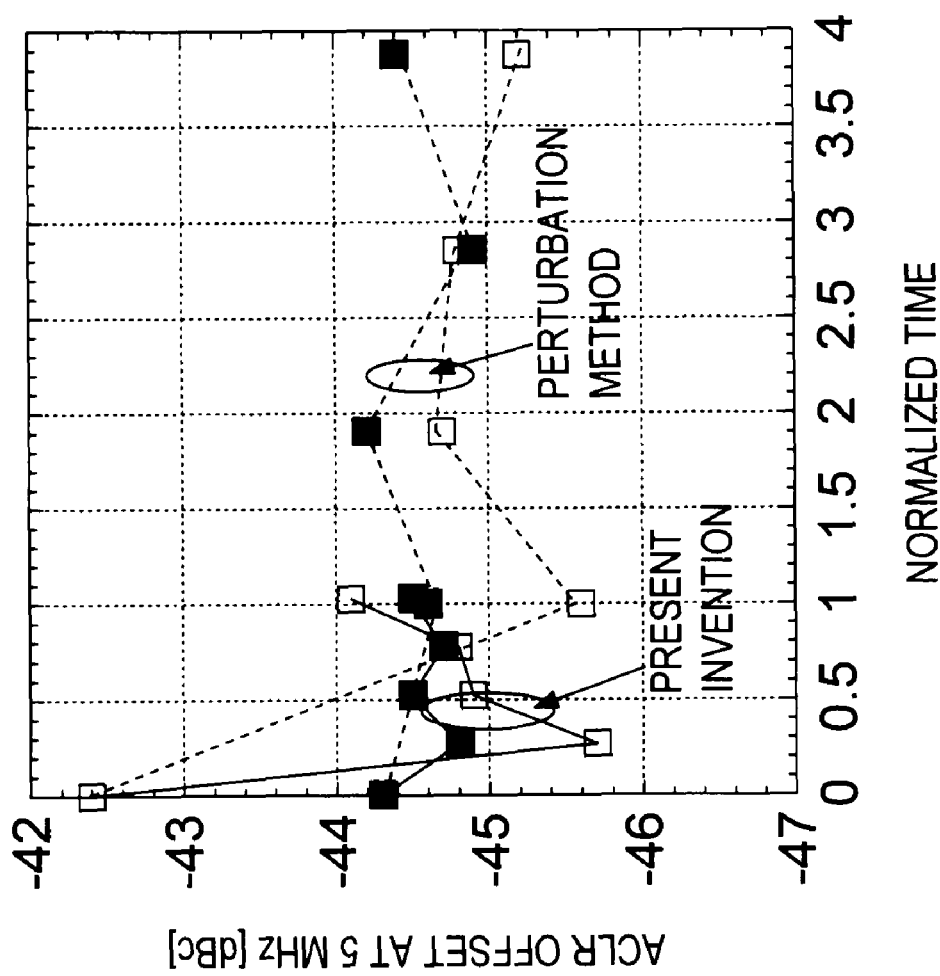
FIG. 15 shows convergence characteristics of a control method according to the present invention and a control method based on the perturbation method.

FIG. 15 shows convergence characteristics of a control method according to the present invention and a control method based on the perturbation method. The horizontal axis represents the time normalized by the convergence time of the present invention, and the vertical axis represents the offset in adjacent channel leakage ratio (ACLR) at 5 MHz. The solid lines indicate convergence by the control method according to the present invention, and the dotted lines indicate convergence by the perturbation method. The control method according to the present invention can converge the adjacent channel leakage ratio (ACLR) in one third of the time needed by the perturbation method.

Figure 16A:
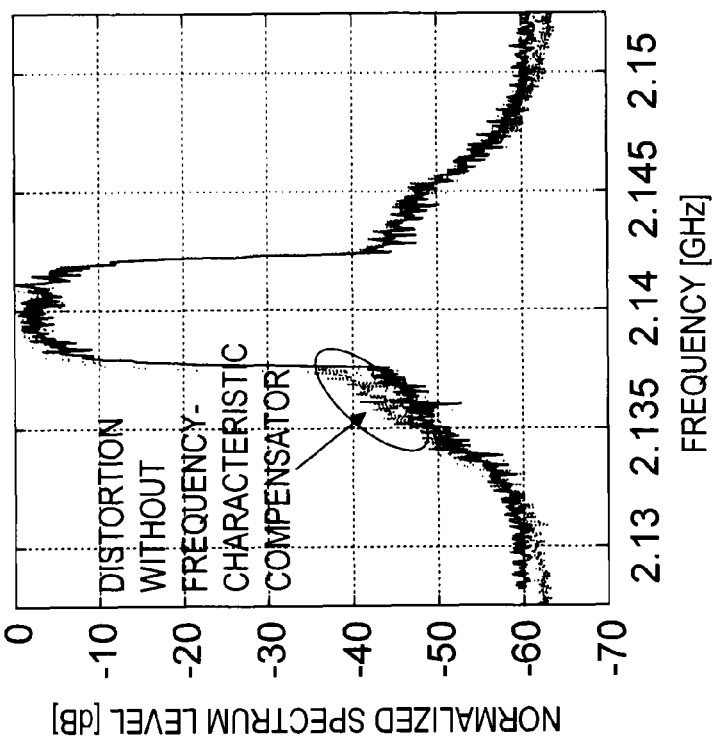
FIG. 16A shows a comparison between the spectrum of a power amplifier output by the control method of the present invention and the spectrum of the power amplifier output without the frequency characteristic compensator.
Figure 16B:
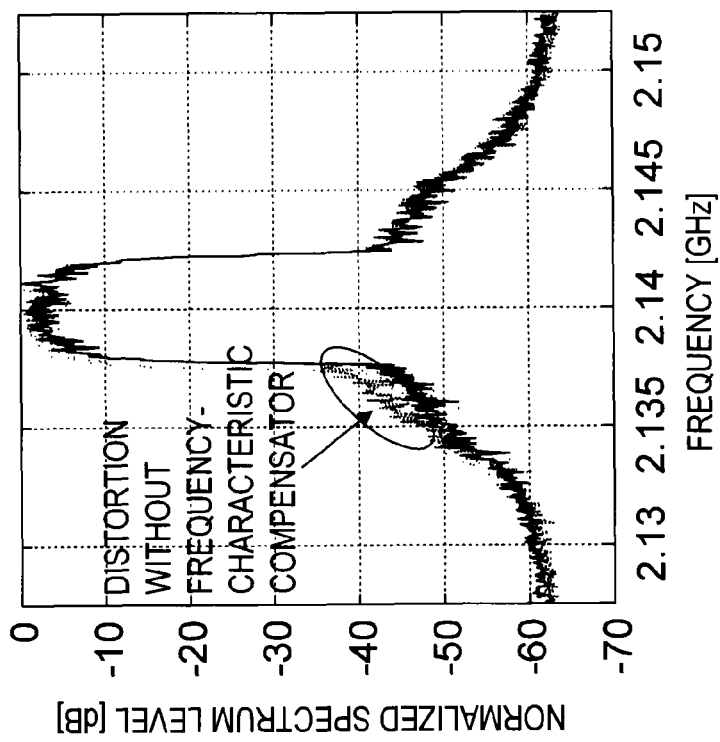
FIG. 16B shows a comparison between the spectrum of the power amplifier output by the perturbation method and the spectrum of the power amplifier output without the frequency characteristic compensator.

FIG. 16A shows a comparison between the spectrum of the power amplifier output by the control method of the present invention and the spectrum of the power amplifier output without the frequency characteristic compensator. FIG. 16B shows a comparison between the spectrum of the power amplifier output by the perturbation method and the spectrum of the power amplifier output without the frequency characteristic compensator. The horizontal axis represents the frequency, and the vertical axis represents the normalized spectrum level. Without the frequency characteristic compensator, the upper side and the lower side of the transmission frequency are asymmetric. With the control method of the present invention and the perturbation method, the upper side and the lower side of the main signal are almost symmetric. Accordingly, the control method of the present invention provides nearly the same ACLR as that provided by the perturbation method.

These experimental results demonstrate that the power series predistorter and the control method thereof in the present invention can reduce the distortion component to the same level as the conventional method, with a small amount of calculation.

Fourth Embodiment

Figure 17:
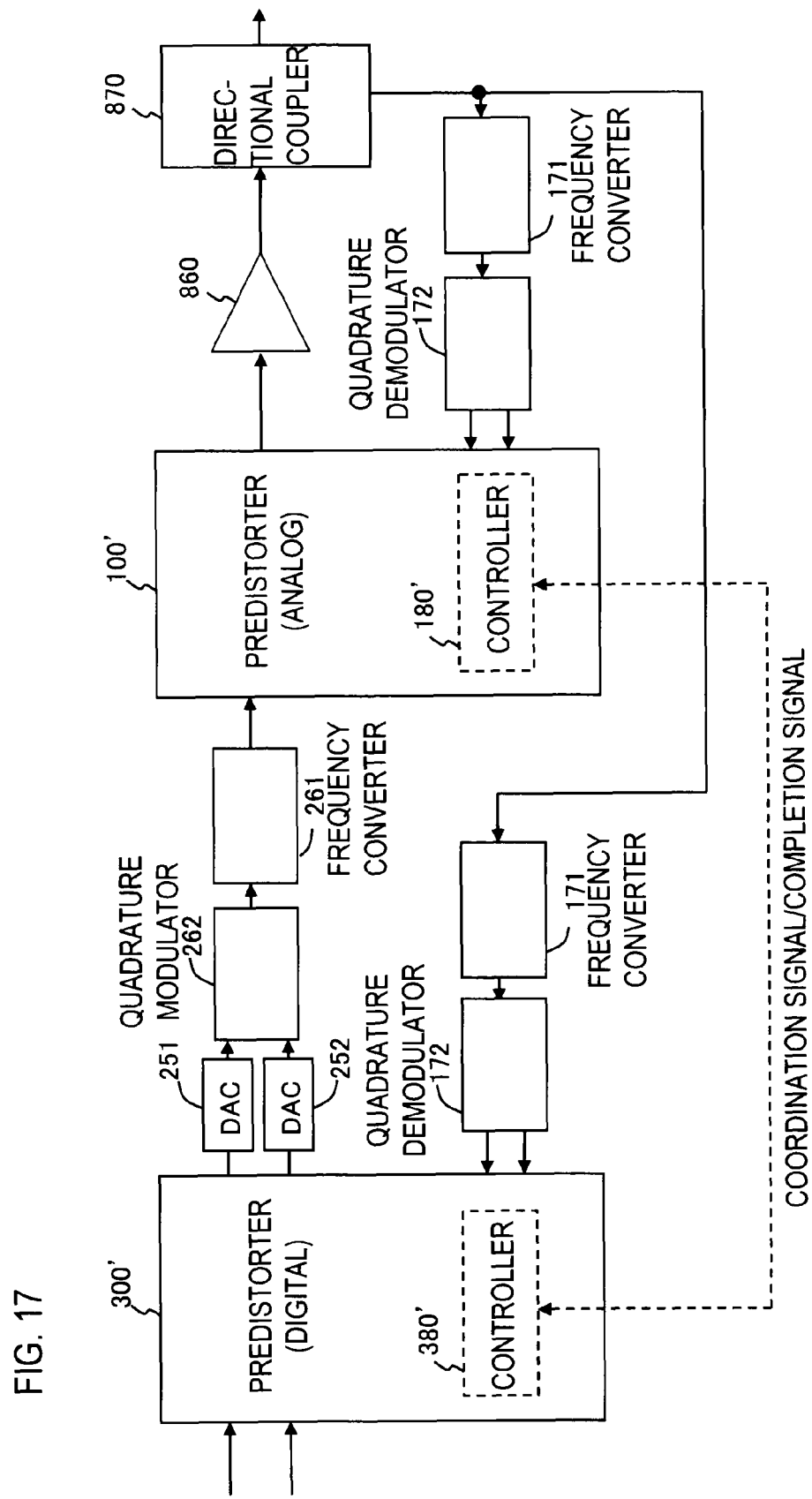
FIG. 17 shows a combination of two power series predistorters.

FIG. 17 shows a combination of two power series predistorters. In the example shown, the power series predistorter 100 of the first embodiment and the power series predistorter 300 of the third embodiment are combined. A feature is that controllers 180' and 380' exchange signals (coordination signal, completion signal) for coordination between the two power series predistorters.

For example, the power series predistorter 100' performs rough distortion compensation by using the vector adjuster 140 and sends a coordination control signal to the power series predistorter 300'. Then, the power series predistorter 300' performs high-precision distortion compensation by using the frequency characteristic compensator 390 and sends a completion signal to the power series predistorter 100'. The analog power series predistorter 100' is suitable for performing high-speed control because the vector adjuster 140 can be formed by the variable phase unit 141 and the variable attenuation unit 142 and because the phase value and the amplitude value can be controlled directly in the RF band. With that method, the magnitude of compensation that should be carried out by the frequency characteristic compensator 390 can be reduced by performing rough distortion compensation with the vector adjuster 140. Therefore, the amount of calculation required to control the digital power series predistorter 300', which has to obtain a phase or amplitude value that minimizes the distortion component for each complex multiplier, can be reduced.

If the upper distortion component and the lower distortion component of the transmission signal are greatly asymmetric, it could be efficient to perform asymmetry compensation first with the power series predistorter 300' and then perform distortion compensation with the power series predistorter 100'.

Fifth Embodiment

Figure 18:
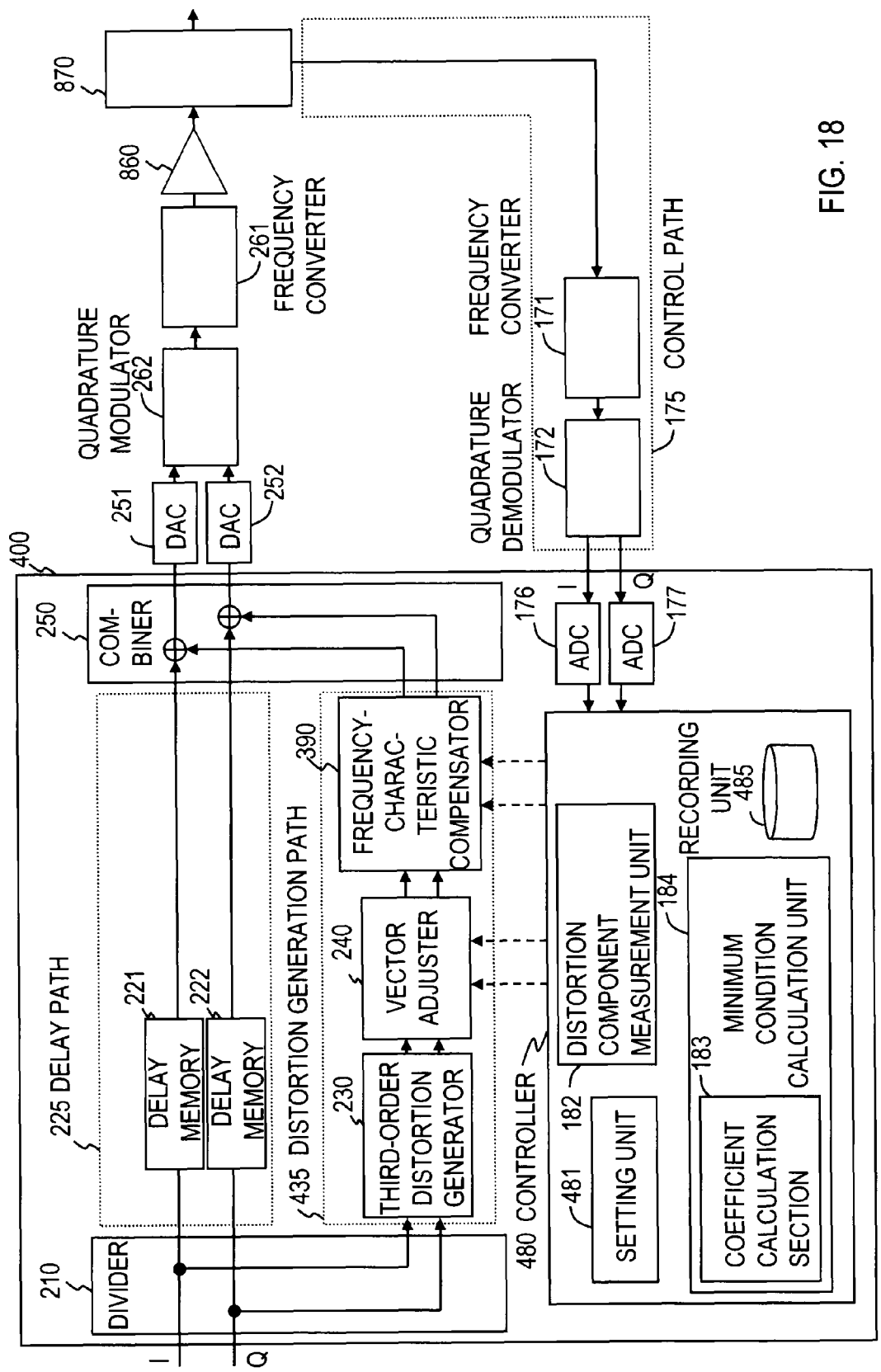
FIG. 18 shows a functional block diagram of a power series predistorter of a fifth embodiment.

FIG. 18 shows a functional block diagram of a power series predistorter 400 of a fifth embodiment. The power series predistorter 400 differs from the power series predistorter 200 of the second embodiment or the power series predistorter 300 of the third embodiment in that both a vector adjuster 240 and a frequency characteristic compensator 390 are included.

The power series predistorter 400 includes a delay path 225 for delaying a signal with delay memories 221 and 222; a distortion generation path 435 having a third-order distortion generator 230, a vector adjuster 240, and a frequency characteristic compensator 390; a divider 210 for dividing the input signal (I component, Q component) between the delay path 225 and the distortion generation path 435; a combiner 250 for combining the output signal (I component, Q component) of the delay path 225 and the output signal (I component, Q component) of the distortion generation path 435; and a controller 480 for controlling the vector adjuster 240 and the frequency characteristic compensator 390. An N-th order distortion generation path (N is an odd number not smaller than 3) for generating a fifth or higher odd-order distortion component may be connected in parallel to the distortion generation path 435. The controller 480 includes a setting unit 481, a distortion component measurement unit 182, a minimum condition calculation unit 184, and a recording unit 485. The setting unit 481 specifies the phase or amplitude value of the output of the vector adjuster 240 and the phase or amplitude value of the output of the frequency characteristic compensator 390. The recording unit 485 records three or more predetermined phase or amplitude values to be specified for sampling. The phase or amplitude values to be recorded for the vector adjuster 240 may be different from or may be the same as those for the frequency characteristic compensator 390.

As in the fourth embodiment, in the control procedure, the phase and amplitude values of the output of the vector adjuster 240 should be adjusted first (as in FIG. 4), and then the phase and amplitude values of the output of the frequency characteristic compensator 390 should be adjusted (as in FIG. 8). The order may be inverted, or the process may be repeated as necessary. The single power series predistorter can perform high-precision distortion compensation and can control the operation with a single digital signal processor (DSP). Therefore, energy can be saved.

What is claimed is:

1. A power series predistorter comprising:
   a delay path for delaying a signal;
   a distortion generation path having an N-th order distortion generator and a vector adjuster;
   a divider for dividing an input signal between the delay path and the distortion generation path;
   a combiner for combining the output of the delay path and the output of the distortion generation path; and
   a controller for controlling the vector adjuster;
   N being an odd number not smaller than 3;
   the controller comprising:
      a setting unit for specifying the phase or amplitude value of the output of the vector adjuster;
      a distortion component measurement unit for measuring a distortion component;
      a minimum condition calculation unit for obtaining a phase or amplitude value that minimizes the distortion component, by using the magnitude of the distortion components corresponding to three or more phase or amplitude values specified for sampling by the setting unit; and
      a recording unit for recording three or more predetermined phase or amplitude values to be specified for sampling.

2. A power series predistorter comprising:
   a delay path for delaying a signal;
   a distortion generation path having an N-th order distortion generator and a frequency characteristic compensator;
   a divider for dividing an input signal between the delay path and the distortion generation path;
   a combiner for combining the output of the delay path and the output of the distortion generation path; and
   a controller for controlling the frequency characteristic compensator;
   N being an odd number not smaller than 3;
   the frequency characteristic compensator comprising:
      an FFT unit for converting a time-series signal to a frequency-domain signal;
      N complex multipliers; and
      an inverse FFT unit for converting the frequency-domain signal to a time-domain signal;
   the controller comprising:
      a setting unit for specifying the phase or amplitude value of the output of each of the complex multipliers;
      a distortion component measurement unit for measuring a distortion component;
      a minimum condition calculation unit for obtaining a phase or amplitude value that minimizes the distortion component, by using the magnitude of the distortion components corresponding to three or more phase or amplitude values specified for sampling by the setting unit; and
      a recording unit for recording three or more predetermined phase or amplitude values to be specified for sampling.

3. A power series predistorter comprising:
   a delay path for delaying a signal;
   a distortion generation path having an N-th order distortion generator, a vector adjuster, and a frequency characteristic compensator;
   a divider for dividing an input signal between the delay path and the distortion generation path;
   a combiner for combining the output of the delay path and the output of the distortion generation path; and
   a controller for controlling the vector adjuster and the frequency characteristic compensator;
   N being an odd number not smaller than 3;
   the frequency characteristic compensator comprising:
      an FFT unit for converting a time-series signal to a frequency-domain signal;
      N complex multipliers; and
      an inverse FFT unit for converting the frequency-domain signal to a time-domain signal;
   the controller comprising:
      a setting unit for specifying the phase or amplitude value of the output of the vector adjuster and the phase or amplitude value of the output of each of the complex multipliers;
      a distortion component measurement unit for measuring a distortion component;
      a minimum condition calculation unit for obtaining a phase or amplitude value that minimizes the distortion component, by using the magnitude of the distortion components corresponding to three or more phase or amplitude values specified for sampling by the setting unit; and
      a recording unit for recording three or more predetermined phase or amplitude values to be specified for sampling.

4. The power series predistorter according to one of claims 1 to 3,
   wherein the minimum condition calculation unit comprises a coefficient calculation section for obtaining the coefficients of a quadratic equation representing the relationship between the phase or amplitude values and the distortion components, from the distortion components corresponding to the three or more phase or amplitude values specified for sampling by the setting unit, and
   the minimum condition calculation unit obtains the phase or amplitude value that minimizes the distortion component, from the coefficients of the quadratic equation obtained by the coefficient calculation section.

5. A power series predistorter control method of the power series predistorter according to claim 1, the control method comprising:
   a vector sampling step in which the setting unit specifies the three or more phase or amplitude values of the output of the vector adjuster for sampling, and the distortion component measurement unit measures the magnitude of each of the distortion components corresponding to the three or more phase or amplitude values;
   a vector minimum condition calculation step in which the minimum condition calculation unit obtains the phase or amplitude value that minimizes the distortion component, from the results of measurement in the vector sampling step; and
   a vector calculation result setting step in which the setting unit specifies the phase or amplitude value in accordance with the result of calculation in the vector minimum condition calculation step.

6. A power series predistorter control method of the power series predistorter according to claim 2, the control method comprising, for each of the complex multipliers:
   a complex multiplication sampling step in which the setting unit specifies the three or more phase or amplitude values of the output for sampling, and the distortion component measurement unit measures the magnitude of each of the distortion components corresponding to the three or more phase or amplitude values;
   a complex multiplication minimum condition calculation step in which the minimum condition calculation unit obtains the phase or amplitude value that minimizes the distortion component, in accordance with the results of measurement in the complex multiplication sampling step; and
   a complex multiplication calculation result setting step in which the setting unit specifies the phase or amplitude value, in accordance with the result of calculation in the complex multiplication minimum condition calculation step.

7. A power series predistorter control method of the power series predistorter according to claim 3, the control method comprising:
   a vector sampling step in which the setting unit specifies three or more phase or amplitude values of the output of the vector adjuster for sampling, and the distortion component measurement unit measures the magnitude of each of the distortion components corresponding to the three or more phase or amplitude values;
   a vector minimum condition calculation step in which the minimum condition calculation unit obtains a phase or amplitude value that minimizes the distortion component, from the results of measurement in the vector sampling step; and
   a vector calculation result setting step in which the setting unit specifies the phase or amplitude value in accordance with the result of calculation in the vector minimum condition calculation step;
   the control method further comprising, for each of the complex multipliers:
   a complex multiplication sampling step in which the setting unit specifies three or more phase or amplitude values of the output for sampling, and the distortion component measurement unit measures the magnitude of each of the distortion components corresponding to the three or more phase or amplitude values;
   a complex multiplication minimum condition calculation step in which the minimum condition calculation unit obtains a phase or amplitude value that minimizes the distortion component, in accordance with the results of measurement in the complex multiplication sampling step; and
   a complex multiplication calculation result setting step in which the setting unit specifies the phase or amplitude value, in accordance with the result of calculation in the complex multiplication minimum condition calculation step.

8. The power series predistorter control method according to one of claims 5 to 7,
   wherein, first, the phase value that minimizes the distortion component is obtained while the amplitude value is kept constant; and
   then, the amplitude value that minimizes the distortion component is obtained after the obtained phase value is specified.

9. The power series predistorter control method according to one of claims 5 to 7,
   wherein, first, the amplitude value that minimizes the distortion component is obtained while the phase value is kept constant; and
   then, the phase value that minimizes the distortion component is obtained after the obtained amplitude value is specified.

10. A power series predistorter control method used when both a first power series predistorter according to claim 1 and a second power series predistorter are provided,
   the second power series predistorter comprising:
   a delay path for delaying a signal;
   a distortion generation path having an N-th order distortion generator and a frequency characteristic compensator;
   a divider for dividing an input signal between the delay path and the distortion generation path;
   a combiner for combining the output of the delay path and the output of the distortion generation path; and
   a controller for controlling the frequency characteristic compensator;
   N being an odd number not smaller than 3;
   the frequency characteristic compensator comprising:
   an FTT unit for converting a time-series signal to a frequency-domain signal;
   N complex multipliers; and
   an inverse FFT unit for converting the frequency-domain signal to a time-domain signal;
   the controller comprising:
   a setting unit for specifying the phase or amplitude value of the output of each of the complex multipliers;
   a distortion component measurement unit for measuring a distortion component;
   a minimum condition calculation unit for obtaining a phase or amplitude value that minimizes the distortion component, by using the magnitude of the distortion components corresponding to three or more phase or amplitude values specified for sampling by the setting unit; and
   a recording unit for recording three or more predetermined phase or amplitude values to be specified for sampling, and
   the control method comprising:
   a step of first controlling the vector adjuster while the settings of the frequency characteristic compensator are kept constant; and
   a step of then controlling the frequency characteristic compensator while the settings of the vector adjuster are kept constant.

11. A power series predistorter control method used when both a first power series predistorter according to claim 1 and a second power series predistorter are provided,
   the second power series predistorter comprising:
   a delay path for delaying a signal;
   a distortion generation path having an N-th order distortion generator and a frequency characteristic compensator;
   a divider for dividing an input signal between the delay path and the distortion generation path;
   a combiner for combining the output of the delay path and the output of the distortion generation path; and
   a controller for controlling the frequency characteristic compensator;
   N being an odd number not smaller than 3;
   the frequency characteristic compensator comprising:
   an FTT unit for converting a time-series signal to a frequency-domain signal;
   N complex multipliers; and
   an inverse FFT unit for converting the frequency-domain signal to a time-domain signal;

the controller comprising:
- a setting unit for specifying the phase or amplitude value of the output of each of the complex multipliers;
- a distortion component measurement unit for measuring a distortion component;
- a minimum condition calculation unit for obtaining a phase or amplitude value that minimizes the distortion component, by using the magnitude of the distortion components corresponding to three or more phase or amplitude values specified for sampling by the setting unit; and
- a recording unit for recording three or more predetermined phase or amplitude values to be specified for sampling, and the control method comprising:
- a step of first controlling the frequency characteristic compensator while the settings of the vector adjuster are kept constant; and
- a step of then controlling the vector adjuster while the settings of the frequency characteristic compensator are kept constant.

* * * * *